(12) United States Patent
Azuma

(10) Patent No.: US 8,203,149 B2
(45) Date of Patent: Jun. 19, 2012

(54) STANDARD CELL HAVING COMPENSATION CAPACITANCE

(75) Inventor: Shoji Azuma, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 589 days.

(21) Appl. No.: 12/385,503

(22) Filed: Apr. 9, 2009

(65) Prior Publication Data

US 2009/0256180 A1    Oct. 15, 2009

(30) Foreign Application Priority Data

Apr. 11, 2008  (JP) ................................ 2008-103572
Jan. 13, 2009  (JP) ................................ 2009-004492

(51) Int. Cl.
*H01L 29/12* (2006.01)
(52) U.S. Cl. .................... 257/71; 257/296; 257/379
(58) Field of Classification Search .................. None
See application file for complete search history.

(56) References Cited

U.S. PATENT DOCUMENTS

| 6,355,948 B2 | 3/2002 | Iwao et al. |
| 6,781,238 B2 | 8/2004 | Nonaka |
| 2001/0035555 A1 | 11/2001 | Nonaka |
| 2002/0000578 A1 | 1/2002 | Iwao et al. |
| 2005/0116268 A1* | 6/2005 | Tahira et al. .................. 257/288 |

FOREIGN PATENT DOCUMENTS

| JP | 2000-353747 | 12/2000 |
| JP | 2001-284537 | 10/2001 |
| JP | 2006-073696 | 3/2006 |
| JP | 2006-253393 | 9/2006 |

* cited by examiner

*Primary Examiner* — Thomas L Dickey
*Assistant Examiner* — Scott R Wilson
(74) *Attorney, Agent, or Firm* — McGinn IP Law Group, PLLC

(57) ABSTRACT

A standard cell includes a capacity element which is made up of a first well diffusion layer into which a first conductive impurity is diffused in a region from a surface of a substrate to a predetermined depth, an insulation film which is provided on the first well diffusion layer, and a first dummy pattern which is provided on the insulation film.

22 Claims, 26 Drawing Sheets

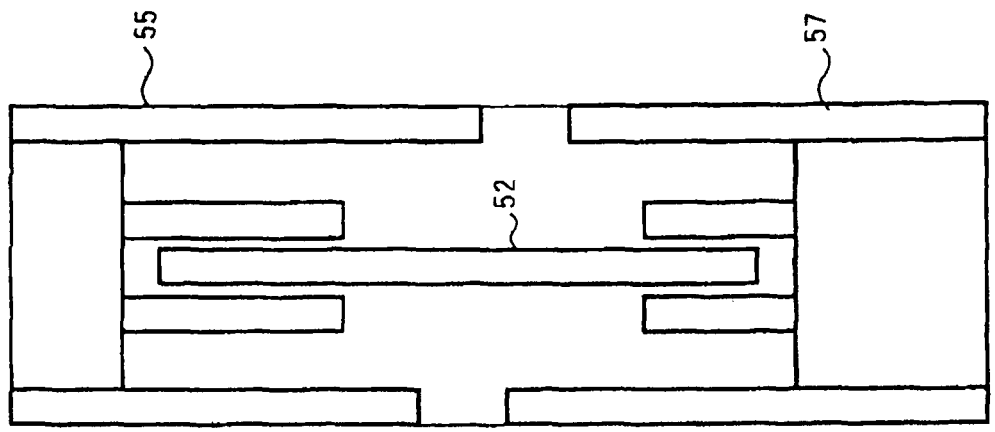
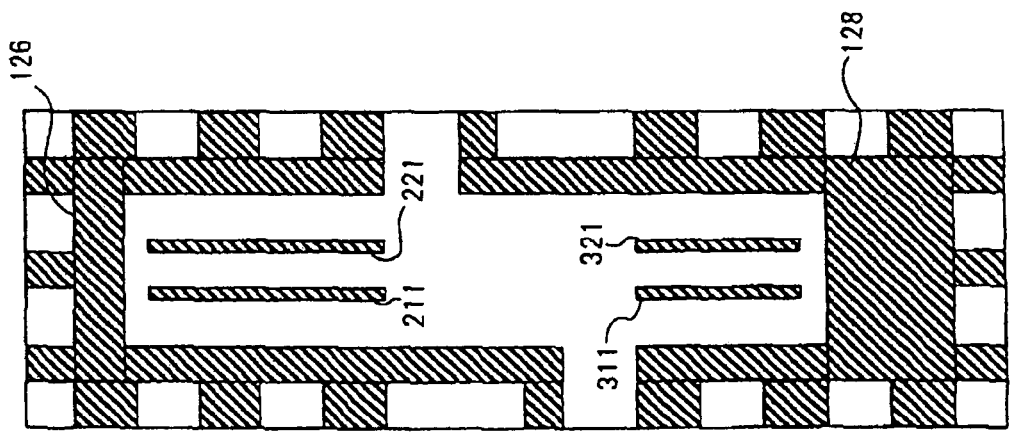

STANDARD CELL HAVING COMPENSATION CAPACITANCE

This application is based upon and claims the benefit of priority from Japanese Patent Application No. 2008-103572 filed on Apr. 11, 2008 and Japanese Patent Application No. 2009-4492 filed on Jan. 13, 2009, the content of which is incorporated by reference.

BACKGROUND OF THE INVENTION

1. Field of the Invention

The present invention relates to a standard cell and a semiconductor device.

2. Description of Related Art

An example of a standard cell used for semiconductor devices will be described. FIG. 1 is a plan perspective view to show a configuration example of a related standard cell. The standard cell shown in FIG. 1 is an inverter circuit, some wirings of which are omitted from the figure.

As shown in FIG. 1, the standard cell has a rectangular outer shape. The standard cell shown in FIG. 1 includes the following two regions. One is a Pch-Tr element region where a P channel Metal Oxide Semiconductor (MOS) transistor element (hereafter indicated by a Pch-Tr element) is formed. The other is an Nch-Tr element region where an N channel MOS transistor element (hereafter, indicated by an Nch-Tr element) is formed.

There are two Pch-Tr elements 21 and 22 provided in a region of N-well diffusion layer 10 to be turned into a Pch-Tr element region. There are also two Nch-Tr elements 31 and 32 provided in the Nch-Tr element region.

Pch-Tr element 21 includes gate electrode 211, drain electrode 212, and source electrode 215. Pch-Tr element 22 includes gate electrode 221, drain electrode 222, and source electrode 215. Pch-Tr elements 21 and 22 share the use of source electrode 215.

Nch-Tr element 31 includes gate electrode 311, source electrode 312, and drain electrode 315. Nch-Tr element 32 includes gate electrode 321, source electrode 322, and drain electrode 315. Nch-Tr elements 31 and 32 share the use of drain electrode 315.

FIG. 2A is a plan view of an active pattern of the standard cell shown in FIG. 1; FIG. 2B is a plan view of a gate pattern of the standard cell shown in FIG. 1; and FIG. 2C is a plan view of a wiring pattern of the standard cell shown in FIG. 1.

It is noted that in FIGS. 2A and 2C, the active pattern and the wiring are drawn by combining rectangular patterns as in the layout design, as a result of which, dividing lines are drawn in a pattern. Since the drawing on a mask used in the lithography process is performed without providing these dividing lines, the diving lines will not appear in the semiconductor device to be formed.

Active pattern 41 shown in FIG. 2A provides a generation region for source electrodes, drain electrodes, and channels of Pch-Tr elements 21 and 22. Active pattern 42 is provided along each side of the two long-sides and one of the short-sides of a rectangle, and in the inner edge thereof. Active pattern 42 provides an opening for applying a predetermined electric potential to N-well diffusion layer 10.

Active pattern 43 provides a generation region for source electrodes, drain electrodes, and channels of Nch-Tr elements 31 and 32. Active pattern 44 is provided along each side of the two long-sides and one of the short-sides of a rectangle, and in the inner edge thereof. Active pattern 44 provides an opening for applying an electric potential that is lower than that to N-well diffusion layer 10, to a P-well diffusion layer.

As shown in FIG. 2B, there are two kinds of dummy patterns provided in the gate pattern, besides gate electrodes of transistor elements. The first kind is a dummy pattern for the purpose of uniformly forming a pattern of gate electrodes at the time of gate-etching. Dummy patterns 25a, 25b, 27a, and 27b correspond to the pattern of this kind. By making the pattern of the gate electrode uniform, the gate length is made uniform, thereby suppressing variation in transistor characteristics.

As shown in FIG. 2B, each of dummy patterns 25a and 25b has an equal length to that of respective gate electrodes 211 and 221, and dummy patterns 25a and 25b are provided in parallel beside gate electrodes 211 and 221 respectively. Each of dummy patterns 27a and 27b has an equal length to that of respective gate electrodes 311 and 321, and dummy patterns 27a and 27b are provided in parallel beside gate electrodes 311 and 321 respectively. These dummy patterns 25a, 25b, 27a, and 27b are kept at a floating potential or fixed to a predetermined electric potential by being connected to the wiring. In this case, the electric potential of dummy patterns 25a, 25b, 27a, and 27b are kept at a floating state.

The second kind is a dummy pattern for the purpose of improving the planarization of an inter-layer insulation film to be formed on a gate pattern. Dummy patterns 26 and 28 correspond to the pattern of this kind. When an inter-layer insulation film formed on a gate pattern is planarized by CMP (Chemical and Mechanical Polishing) processing, a data rate, which is the proportion of the area occupied by the pattern in the gate-electrode forming layer, is preferably uniform in anywhere of the gate-electrode forming layer. Accordingly, it is necessary to increase the data rate of portions having a lower pattern density compared with the vicinity of a gate-electrode forming region, where the pattern density per unit area is relatively large. Specifically, the sizes of dummy patterns 26 and 28 are determined such that the pattern densities are within a predetermined range and dummy patterns 26 and 28 are provided as shown in FIGS. 1 and 2B.

Dummy patterns 26, 28 are kept at a floating potential or are fixed to a predetermined electric potential by being connected with the wiring. In this case, the electric potential of dummy pattern 26, 28 is fixed to a predetermined electric potential.

As shown in FIG. 2C, the wiring pattern includes wirings 51, 52, and 53. Although wiring 51 appears to be made up of a plurality of patterns, it is in reality made up of one pattern as described above. The same is also true with wiring 53.

Wiring 51 is connected with each of drain electrodes 212 and 222 and source electrode 215 of the Pch-Tr element, and active pattern 42 via well contact 61 as shown in FIGS. 1, 2A and 2C. Well contact 61 is a plug provided so as to pass through an inter-layer insulation film (not shown) and a gate oxide film (not shown) which are formed between the active pattern and the wiring pattern. Due to well contact 61, N-well diffusion layer 10 and drain electrodes 212 and 222 will have the same electric potential.

Wiring 53 is connected with each of source electrodes 312 and 322 and drain electrode 315 of the Nch-Tr element, and active pattern 43 via sub-contact 63 as shown in FIGS. 1, 2A and 2C. Sub-contact 63 is provided so as to pass through an inter-layer insulation film (not shown) and a gate oxide film (not shown) which are formed between the active pattern and the wiring pattern. Due to sub-contact 63, the P-well diffusion layer (not shown) and source electrode 312 and 322 will have the same electric potential.

It is noted that when the substrate on which the standard cell shown in FIG. 1 is formed is a P-type substrate, the P-well diffusion layer (not shown) and the substrate will have the same electric potential. Therefore, the contact plug which connects a P-well diffusion layer with a wiring pattern is referred to as sub-contact 63.

Contact 62 is a plug provided so as to pass through an inter-layer insulation film (not shown) formed between dummy pattern 26 and wiring 51 as shown in FIGS. 1, 2B, and 2C. Dummy pattern 26 will have the same electric potential as that of N-well diffusion layer 10. Moreover, contact 64 is a plug provided so as to pass through an inter-layer insulation film (not shown) formed between dummy pattern 28 and wiring 53. Dummy pattern 28 will have the same electric potential as that of the P-well diffusion layer (not shown).

As shown in FIGS. 1, 2A, and 2C, wiring 52 connects source electrode 215 of the Pch-Tr element with drain electrode 315 of the Nch-Tr element via well contact 61 and sub-contact 63.

Well contact 61, contacts 62 and 64, and sub-contact 63 are formed in the same process. The material for well contact 61, contacts 62 and 64, and sub-contact 63 is metal such as tungsten and copper, or a conductive material such as polysilicon doped with a conductive impurity.

Next, a standard cell including a resistance element will be described.

A DRAM (Dynamic Random Access Memory) is provided with a reference circuit for generating various reference voltages by resistive potential division. A reference circuit often utilizes resistance elements which are formed by diffusing a conductive impurity into a site from the surface to a predetermined depth of a substrate or well.

The configuration of a standard cell including a resistance element formed of a diffusion layer will be described. In this case, it is supposed that a MOS transistor is formed on the substrate as well.

FIG. 3A is a plan perspective view to show a configuration example of a standard cell including a resistance element; and FIG. 3B shows an equivalent circuit of the standard cell shown in FIG. 3A. FIG. 4 is a sectional view taken along line AB shown in FIG. 3A.

As shown in FIG. 4, a P-well diffusion layer is provided in each element-forming region of a resistance element and a MOS transistor, from the surface of P-type conductive substrate (simply referred to as "P-substrate") 700 to a predetermined depth, and gate oxide film 710 is provided as an insulation film on the surface of P-substrate 700.

As shown in FIGS. 3A and 4, resistance element 500 is formed of a diffusion layer of an N-type conductive impurity and is formed in a region from the surface of P-well diffusion layer 600 to a predetermined depth. N-well diffusion layer 602 is formed in the surrounding of P-well diffusion layer 600, and the side face of P-well diffusion layer 600 is covered with N-well diffusion layer 602. FIG. 3A shows outer edge 622a and inner edge 622b of the pattern of N-well diffusion layer 602. Further, as shown in FIG. 4, deep N-well diffusion layer 604 is formed underneath P-well diffusion layer 600, and the bottom face of P-well diffusion layer 600 is covered with deep N-well diffusion layer 604.

Trench oxide film 551 is formed in the area that surrounds resistance element 500, and the side face of resistance element 500 is covered with trench oxide film 551. Dummy pattern 502 is provided above trench oxide film 551 in such a way as to surround the forming region of resistance element 500 along the planer pattern of trench oxide film 551. This dummy pattern 502 corresponds to the second of the two kinds of dummy patterns described above and is for the purpose of planarization by CMP processing. Dummy pattern 502 and the gate electrode (not shown) of the MOS transistor are in the same layer.

The reason why dummy pattern 502 is provided in the area that surrounds resistance element 500 is for the purpose of preventing the insulation film formed above the gate electrode from being ground faster than other sites thereby from being removed from the surface when it is ground by CMP processing. Dummy pattern 504 described later also has the same role as that of dummy pattern 502. The material of dummy patterns 502 and 504 is the same as that of the gate electrode (not shown), and in this case, they are made of a polysilicon layer into which a conductive impurity is diffused. Further, hereafter, the polysilicon layer into which a conductive impurity is diffused is simply referred to as a "polysilicon layer".

Sub-contact diffusion layer 512 into which a P-type conductive impurity is diffused is formed outside trench oxide film 551. Since sub-contact diffusion layer 512 has a higher concentration of conductive impurities than that in P-well diffusion layer 600, it is indicated by "P+" in FIG. 4. The reason why sub-contact diffusion layer 512 has a higher concentration of conductive impurities is to decrease the contact resistance between the plug provided in the overlying layer and P-well diffusion layer 600. A diffusion layer for making contact with P-well diffusion layer 600, which has the same kind of conductive impurities as that of P-substrate 700, is referred to as a sub-contact diffusion layer.

On sub-contact diffusion layer 512, there is formed gate oxide film 710 which has a smaller film thickness than that of the trench oxide film formed next to each side of sub-contact diffusion layer 512. Because providing an opening through gate oxide film 710 will enable making contact with P-well diffusion layer 600 via sub-contact diffusion layer 512, the forming site of sub-contact diffusion layer 512 corresponds to the opening pattern of the present invention.

Trench oxide film 553 is formed in the area that surrounds sub-contact diffusion layer 512, and the side face of sub-contact diffusion layer 512 is covered with trench oxide film 553. Dummy pattern 504 is provided above trench oxide film 553 along the planar pattern of trench oxide film 553. Since the bottom face of trench oxide film 553 is at halfway point with respect to the depth of N-well diffusion layer 602, the side face of P-well diffusion layer 600 is covered with trench oxide film 553 and N-well diffusion layer 602.

Well-contact diffusion layer 514 into which an N-type conductive impurity is diffused is formed in the area that surrounds trench oxide film 553. Since well-contact diffusion layer 514 has a higher concentration of the conductive impurity than that of N-well diffusion layer 602, it is indicated by "N+" in FIG. 4. The reason why well-contact diffusion layer 514 has a higher concentration of the conductive impurities is to decrease contact resistance between the plug provided in the overlying layer and N-well diffusion layer 602. A diffusion layer for making contact with N-well diffusion layer 602 is referred to as a well-contact diffusion layer.

On well-contact diffusion layer 514, there is formed gate oxide film 710, which has a smaller film thickness than that of the trench oxide film formed next to each side of well-contact diffusion layer 514. Because providing an opening through gate oxide film 710 will enable making contact with N-well diffusion layer 602 via well-contact diffusion layer 514, the forming site of well-contact diffusion layer 514 corresponds to the opening pattern of the present invention.

Compared to resistance element 500 and well-contact diffusion layer 514 concerning the concentration of N-type conductive impurities, the concentration of N-type conductive impurities of resistance element 500 is lower than that of well-contact diffusion layer 514. Therefore, resistance element 500 is indicated by "N−" and well-contact diffusion layer 514 is indicated by "N+" in FIG. 4.

As shown in FIG. 3A, one of the two ends of resistance element 500 of a rectangular pattern is connected with tungsten wiring 533 via a contact, and the other end is connected with tungsten wiring 537 via a contact. Further, tungsten wiring 537 is connected with sub-contact diffusion layer 512 via sub-contact 522. Each of tungsten wiring 531 and tungsten wiring 535 is connected with well-contact diffusion layer 514 via well contact 524. Sub-contact 522 is a plug for connecting the wiring with sub-contact diffusion layer 512, and well contact 524 is a plug for connecting the wiring with well-contact diffusion layer 514.

The planar pattern of tungsten wiring 533 is rectangular. The planar pattern of tungsten wiring 537 has a shape in which a rectangular pattern and the planar pattern of sub-contact diffusion layer 512 are superposed with each other. However, in order to arrange that tungsten wiring 533 and tungsten wiring 537 in the same layer do not come into contact with each other, a part of the wiring pattern corresponding to the planar pattern of sub-contact diffusion layer 512 is removed as shown in FIG. 3A.

Tungsten wiring 531 and tungsten wiring 535, as shown in FIG. 3A, have a shape in which a portion which intersects with each of tungsten wiring 537 and tungsten wiring 533 is removed from the wiring pattern corresponding to the planar pattern of well-contact diffusion layer 514.

As shown in FIG. 4, insulation film 712 and insulation film 714 are stacked one after another on gate oxide film 710. Dummy pattern 502 and dummy pattern 504 are provided within insulation film 712 and on gate oxide film 710. Sub-contact 522 passes through gate oxide film 710 and insulation film 712 to reach sub-contact diffusion layer 512. Well contact 524 passes through gate oxide film 710 and insulation film 712 to reach well-contact diffusion layer 514. Tungsten wirings 531, 533, 535, and 537, which are in the same layer, are provided within insulation film 714 and on insulation film 712.

In order to make resistance element 500 insusceptible to noises from the substrate, deep N-well diffusion layer 604 is interposed between P-well diffusion layer 600, in which resistance element 500 is formed, and a P-well diffusion layer (not shown), in which another element (such as a transistor element in the vicinity) is formed, to separate respective P-well diffusion layers of resistance element 500 and another element. In this way, resistance element 500 is disposed on P-well diffusion layer 600 dedicated for its own element.

For the above described purpose, deep N-well diffusion layer 604 needs to be kept at a high-voltage potential so as to be reversely biased in the P-N direction with respect to P-well diffusion layer 600 without fail. N-well diffusion layer 602 is provided in order to supply a high-voltage potential to deep N-well diffusion layer 604, and well-contact diffusion layer 514 is provided to supply a high-voltage potential to N-well diffusion layer 602. A high-voltage is, for example, a power supply voltage (VDD). Hereafter, description will be made of the cases in which a VDD potential is applied. FIGS. 3A and 3B show wirings to which a VDD potential is applied. A VDD potential is applied to each of tungsten wirings 531, 533, and 535.

As so far described with reference to FIGS. 3A and 4, resistance element 500 is disposed in the center of the forming region of resistance element 500; sub-contact diffusion layer 512 for supplying an electric potential to P-well diffusion layer 600 is disposed around resistance element 500; and well-contact diffusion layer 514 for supplying an electric potential to N-well diffusion layer 602 and deep N-well diffusion layer 604 is disposed around sub-contact diffusion layer 512. Further, dummy pattern 502 is disposed between resistance element 500 and sub-contact diffusion layer 512; and dummy pattern 504 is disposed between sub-contact diffusion layer 512 and well-contact diffusion layer 514.

If a pattern made up of a polysilicon layer, such as dummy patterns 502 and 504, is not disposed in the area that surrounds resistance element 500 at all, the forming region of resistance element 500 will have an extremely low data rate of polysilicon layer compared with the region where a pattern of polysilicon layer is disposed. This will adversely affect the planarization by CMP processing. In order to avoid occurrence of the problem, dummy patterns 502 and 504 are disposed in the area that surrounds resistance element 500 so that the data rate of polysilicon layer in the forming region of resistance element 500 becomes closer to that in the forming region of a MOS transistor. Dummy patterns 502 and 504 are kept at a floating or VDD potential.

In recent years, as the degree of integration of semiconductor devices has increased, memory LSIs have larger storage capacity and system LSIs have more functions implemented, as a result of which the size of semiconductor devices has become larger. Moreover, improvements in signal processing speed have resulted in semiconductor devices having increased speeds. For semiconductor devices whose sizes steadily increase and which have higher speeds, the noise of power supply lines has become a problem. As a countermeasure, Japanese Patent Laid-Open No. 2006-253393 (hereinafter referred to as "Patent Document 1") discloses an example of the method of suppressing the fluctuation of power supply voltage by providing a compensation capacity between power supplies having different electric potentials.

As a result of advances integration scale and processing speed, semiconductor devices utilize not only power supply voltages supplied from the outside, but also various internal power supply voltages which are produced by decreasing or increasing the power supply voltage supplied from the outside by means of an internal circuit. For that reason, a compensation capacity becomes necessary for each of those internal power supplies besides power supply voltages supplied from the outside. Although the compensation capacity is preferably provided in the free space of the chip, the necessary quantity of the compensation capacity may become very large, and the amount of free space in the chip may not be enough to provide the compensation capacity.

The above described reference circuit will be described by way of example. Since the reference circuit is made up of analog circuits, it is characteristically susceptible to noise. Taking into consideration the following two points: that the power supply voltage supplied to the reference circuit will be the original voltage to create a reference voltage in a chip; and that the reference circuit is susceptible to noise, it is particularly important that the reference circuit be disposed with a compensation capacity to control the power supply noise, and thus it becomes necessary to secure layout space for that.

Securing space for disposing compensation capacity in a chip will result in an increase in chip size. When compensation capacity is provided in the free space of a chip within a permissible range without increasing the chip size, countermeasure against the noise of the power supply lines may be insufficient and thus the noise may adversely affect circuit characteristics.

A decision must be made whether to give a higher priority to compensation capacity and to provide the necessary quantity of compensation capacity in a chip by increasing the chip size, or to give a higher priority to chip size and to provide a quantity of compensation capacity which can be disposed in the free space of the chip, but taking the risk that there will be an occurrence of noise from the power supply; however, solving one problem will result in a manifestation of the other problem.

Patent Document 1 discloses a technology of providing a compensation capacity in a circuit cell as a countermeasure against the problem that sufficient layout space for compensation capacity cannot be obtained. However, in the technology disclosed in the foregoing patent, it is considered to select the most important configuration from among a gate dummy pattern for compensation capacity, a well contact, and a sub-contact, depending on the purpose of the circuit cell, and the configuration selected is disposed in the circuit cell. Therefore, the object is not to dispose a gate dummy pattern for compensation capacity, a well contact, and a sub-contact all in a single cell.

SUMMARY

In one embodiment, there is provided a standard cell that includes a capacity element which is made up of a first well diffusion layer into which a first conductive impurity is diffused in a region from a surface of a substrate to a predetermined depth, an insulation film provided on the first well diffusion layer, and a first dummy pattern provided on the insulation film.

In one embodiment, there is provided a semiconductor device that includes a plurality of the above described standard cells, wherein a plurality of the standard cells are disposed such that first capacity elements of adjacent standard cells are overlapped.

In the present invention, with a dummy pattern as an electrode; a first well diffusion layer as another electrode; and an insulation film therebetween as a dielectric, a capacitor is configured in which a dielectric is interposed between the two electrodes. The capacitor which utilizes a dummy pattern provided in the standard cell enables obtaining compensation capacity for controlling noise.

BRIEF DESCRIPTION OF THE DRAWINGS

The above features and advantages of the present invention will be more apparent from the following description of certain preferred embodiments taken in conjunction with the accompanying drawings, in which:

FIG. 6A is a plan view to show the pattern of gates of the standard cell shown in FIG. 5;

FIG. 6B is a plan view to show the pattern of wirings of the standard cell shown in FIG. 5;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

The configuration of a standard cell of the semiconductor device of the present embodiment will be described. The standard cell of the present embodiment is configured to include a MOS transistor.

Figure 5:
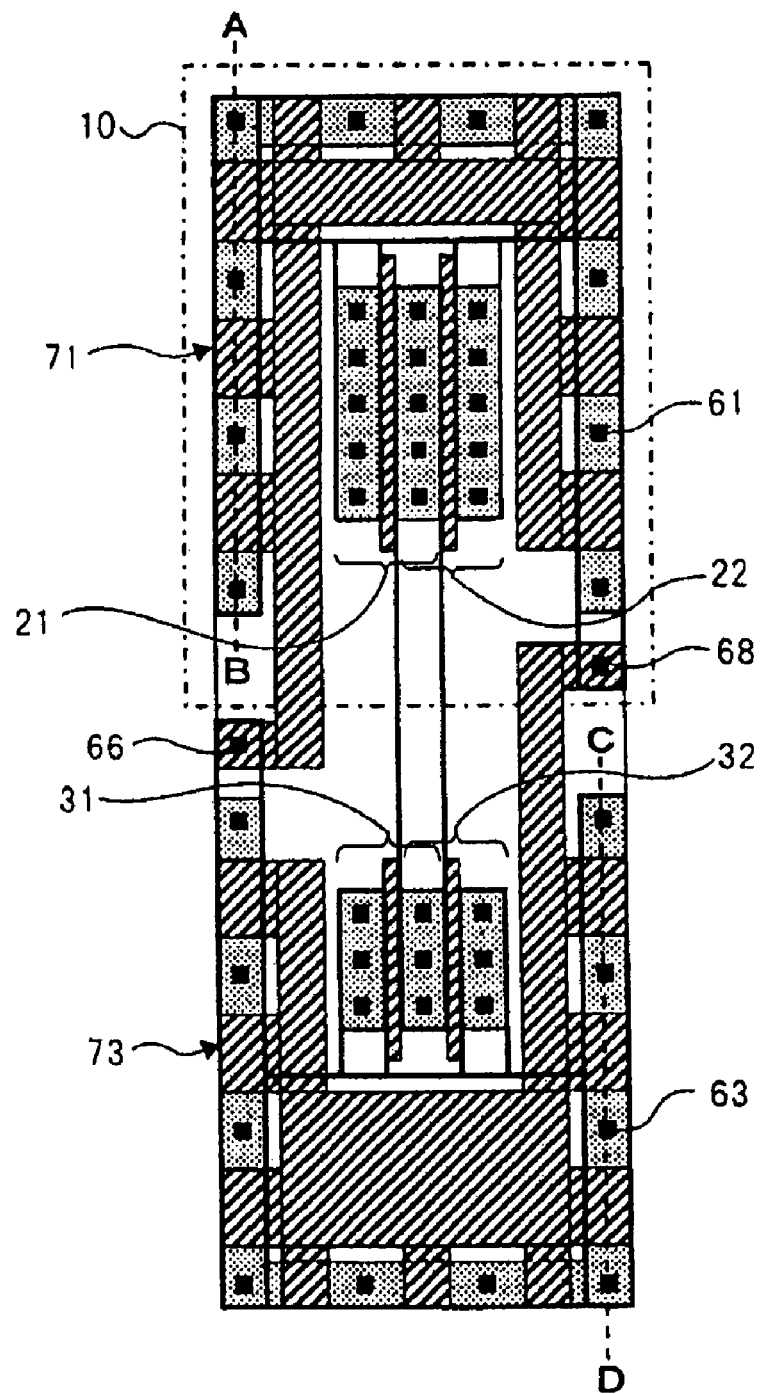
FIG. 5 is a plan perspective view to show a configuration example of the standard cell of a first embodiment.

FIG. 5 is a plan perspective view to show a configuration example of the standard cell of the present embodiment. The standard cell shown in FIG. 5 is an inverter circuit, in which some of the wirings are omitted from the figure.

Figure 1:
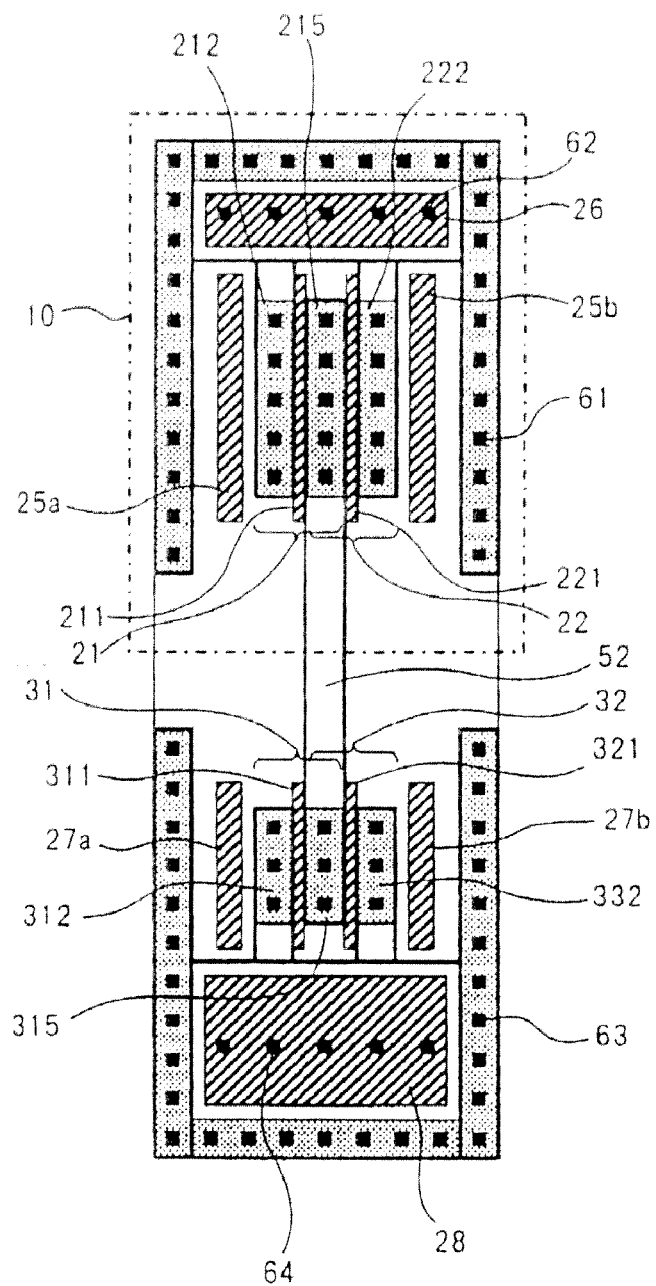
FIG. 1 is a plan perspective view to show a configuration example of a related standard cell.

FIG. 6A is a plan view to show the pattern of gates of the standard cell shown in FIG. 5, and FIG. 6B is a plan view to show the pattern of wirings of the standard cell shown in FIG. 5. Since the active patterns are the same as in FIG. 2A, description thereof will be omitted. Configurations similar to those shown in FIG. 1 are given the same symbols and detailed description thereof will be omitted.

It is noted that dummy patterns of FIG. 6A are drawn by combining rectangular patterns as in the case of a layout design. Therefore, dividing lines are drawn in a pattern. Since drawing on a mask used in the lithography process is performed without providing these dividing lines, they will not appear in the semiconductor device to be formed. This is also true with the wiring pattern shown in FIG. 6B.

As shown in FIG. 5, the standard cell of the present embodiment has a rectangular outer shape. In the standard cell of the present embodiment, compensation capacity element 71 is provided around Pch-Tr elements 21 and 22, and compensation capacity element 73 is provided around Nch-Tr elements 31 and 32. Hereafter, the configuration of compensation capacity elements 71 and 73 will be described in detail.

Figure 2A:
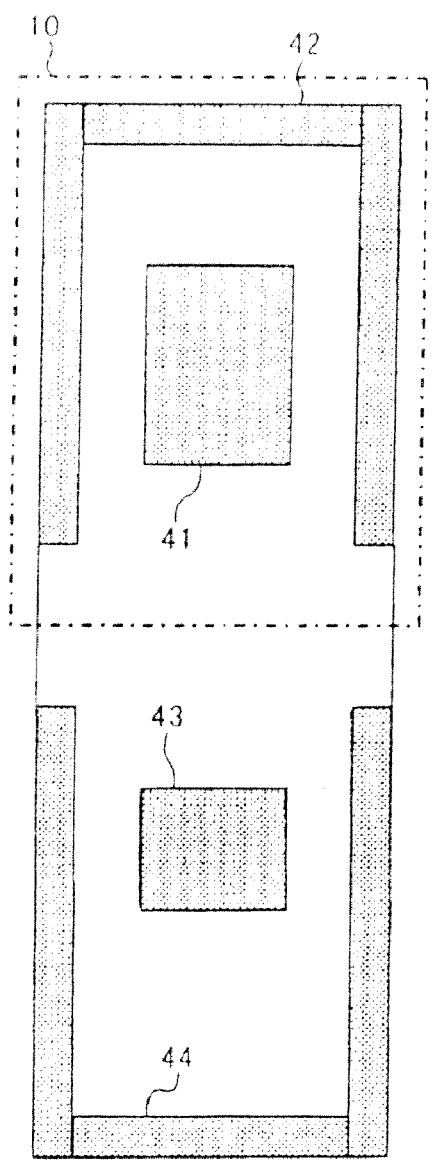
FIG. 2A is a plan view of an active pattern of the standard cell shown in FIG. 1.
Figure 2B:
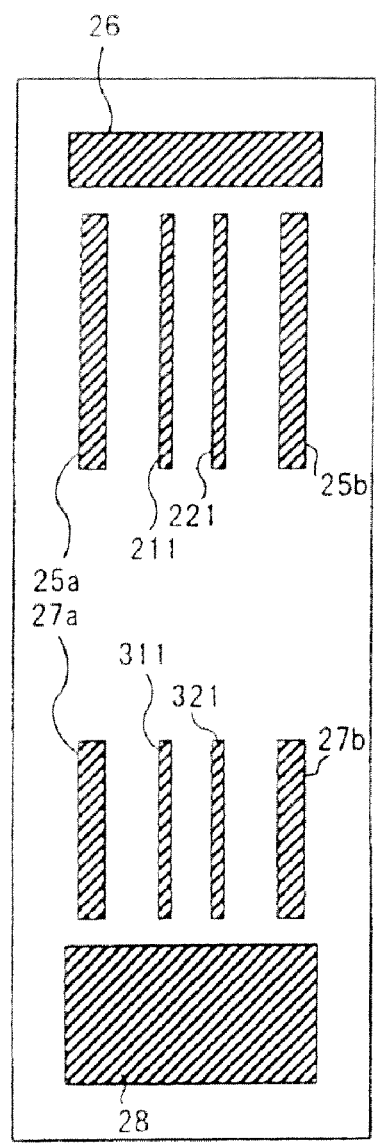
FIG. 2B is a plan view of a gate pattern of the standard cell shown in FIG. 1.

In a Pch-Tr element region, as shown in FIG. 6A, dummy pattern 126 is configured to include dummy patterns 25a, 25b, and 26 shown in FIG. 2B. The portion of dummy pattern 126 corresponding to dummy patterns 25a and 25b is provided in parallel with the gate electrode of Pch-Tr elements 21 and 22. The portion corresponding to dummy pattern 26 is provided between the active pattern on the side of short-side and Pch-Tr elements 21 and 22.

Further, in the present embodiment, a part of dummy pattern 126 is provided on active pattern 42 shown in FIG. 2A, and this portion becomes part of the configuration of compensation capacity element 71. Dummy pattern 126 is connected with wiring 57 shown in FIG. 6B via contact 66 shown in FIG. 5.

In an Nch-Tr element region, as shown in FIG. 6A, dummy pattern 128 is configured to include dummy patterns 27a, 27b, and 28 shown in FIG. 2B. The portion of dummy pattern 128 corresponding to dummy patterns 27a and 27b is provided in parallel with the gate electrode of Nch-Tr elements 31 and 32. The portion corresponding to dummy pattern 28 is provided between the active pattern on the side of short-side and Nch-Tr elements 31 and 32.

Further, in the present embodiment, a part of dummy pattern 128 is provided on active pattern 44 shown in FIG. 2A and this portion becomes part of the configuration of compensation capacity element 73. Dummy pattern 128 is connected with wiring 55 shown in FIG. 6B via contact 68 shown in FIG. 5.

Contacts 66 and 68 are formed concurrently with well contact 61 and sub-contact 63. In the present embodiment, gate electrodes 211, 221, 311, and 321 and dummy patterns 126 and 128 are formed of polysilicon doped with a conductive impurity.

Figure 2C:
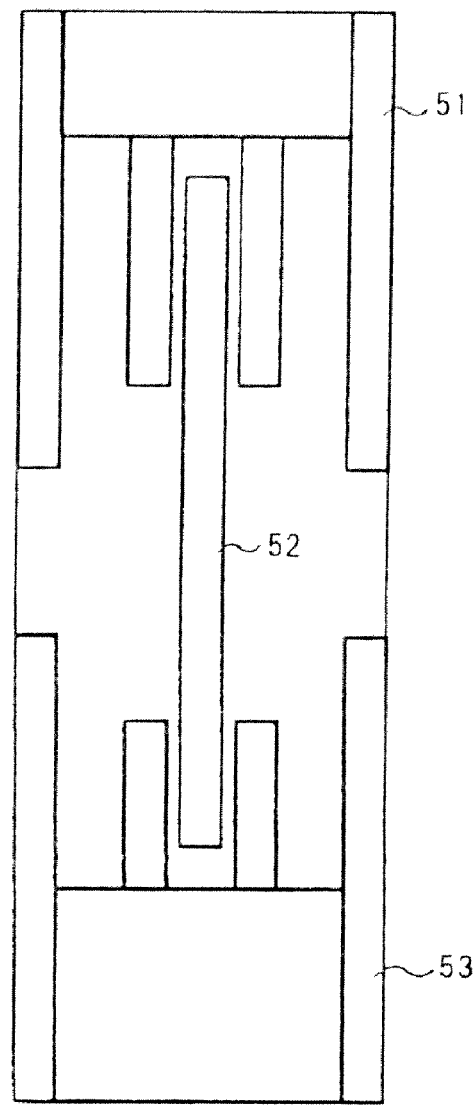
FIG. 2C is a plan view of a wiring pattern of the standard cell shown in FIG. 1.

Wiring 55 shown in FIG. 6B is longer than the pattern of wiring 51 shown in FIG. 2C by the length of the portion where the right end portion in the figure forms contact 68. In contrast, wiring 57 shown in FIG. 6B is longer than the pattern of wiring 53 shown in FIG. 2C by the length of the portion where the left end portion in the figure forms contact 66.

Figure 7:
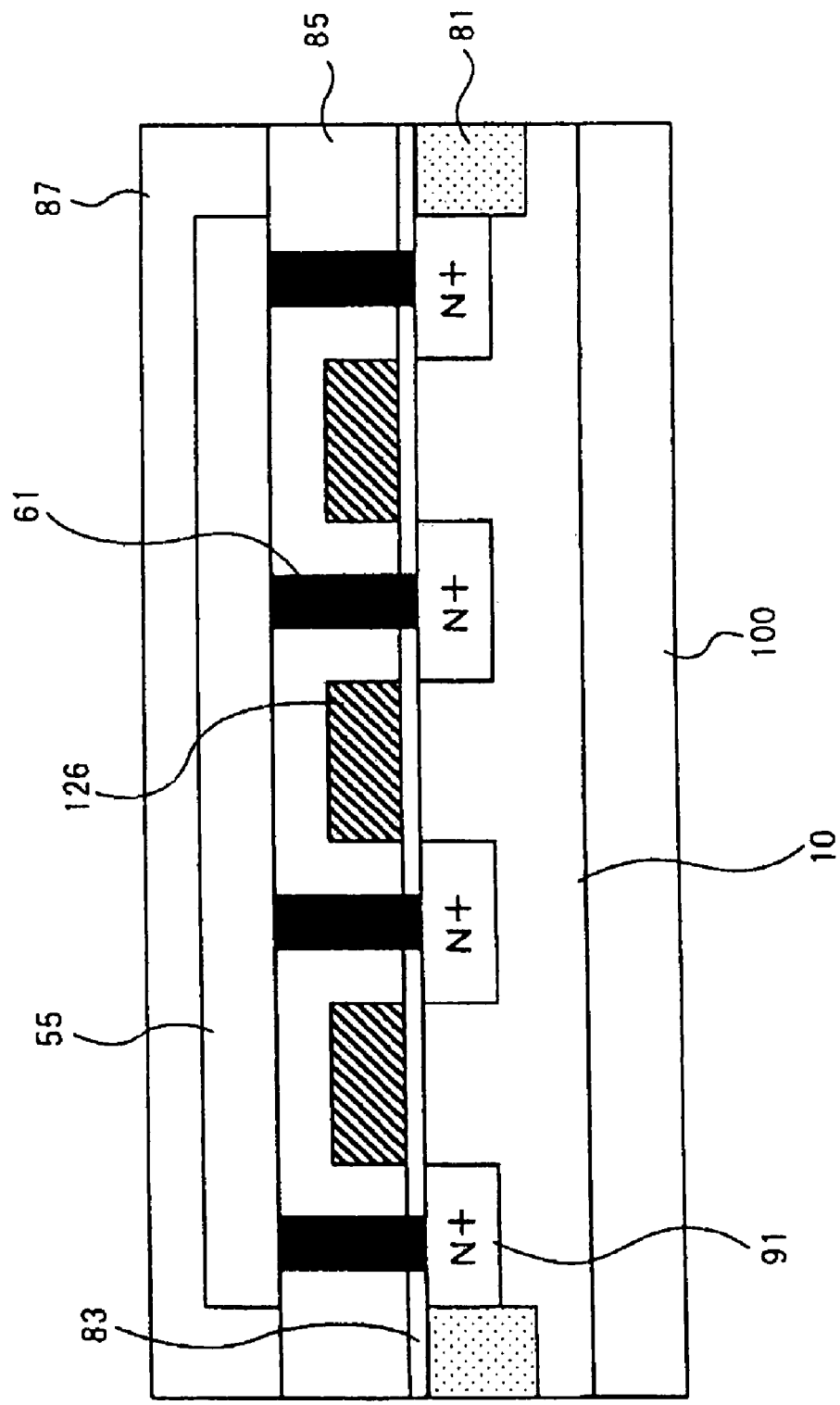
FIG. 7 is a sectional view taken along line A-B shown in FIG. 5.
Figure 8:
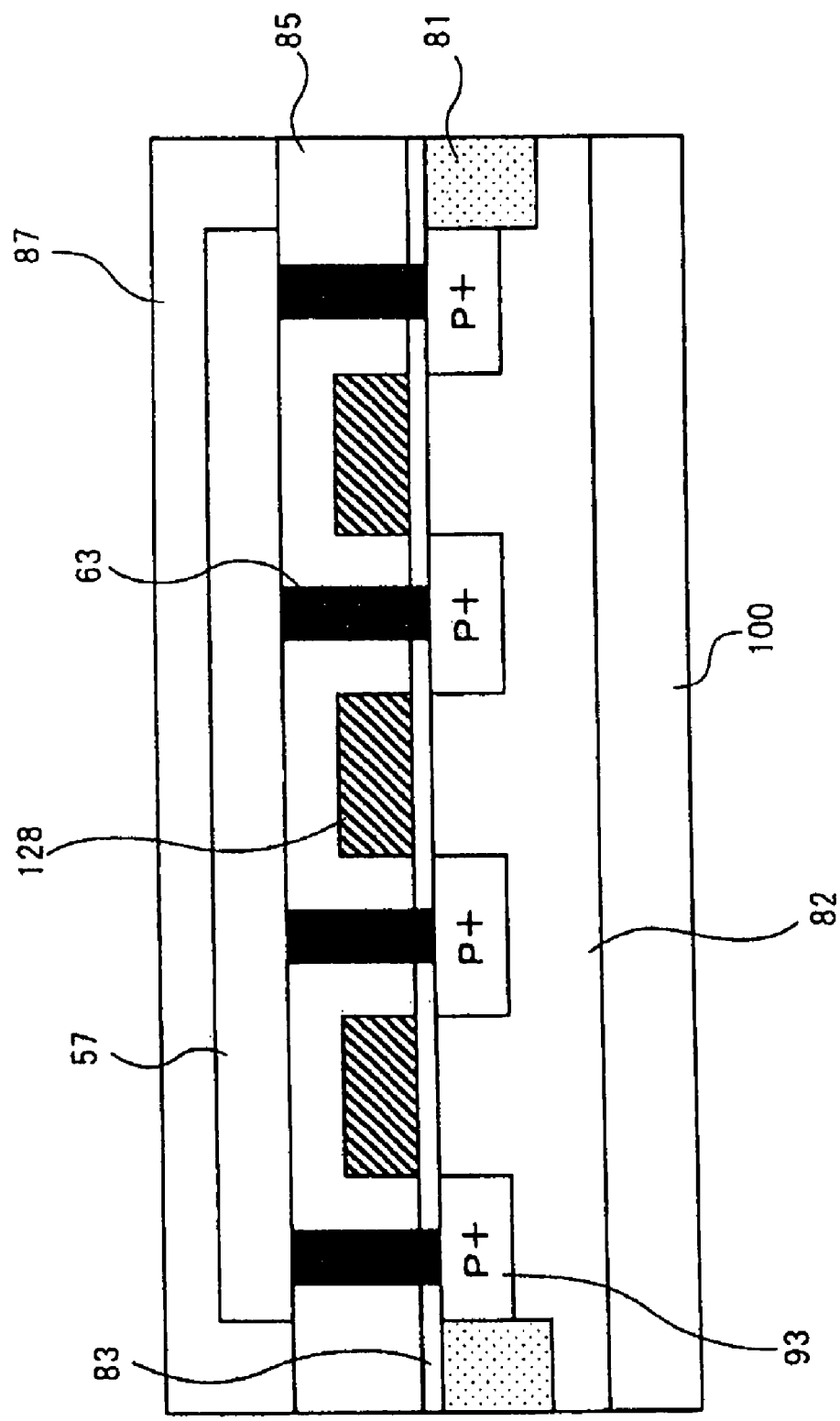
FIG. 8 is a sectional view taken along line C-D shown in FIG. 5.

FIG. 7 is a sectional view taken along line A-B shown in FIG. 5; and FIG. 8 is a sectional view taken along line C-D shown in FIG. 5. FIG. 7 shows a section of compensation capacity element 71 in a Pch-Tr element region. FIG. 8 shows a section of compensation capacity element 73 in an Nch-Tr element region.

As shown in FIG. 7, N-well diffusion layer 10 is provided from the surface of substrate 100 to a predetermined depth, and trench oxide film 81 is provided in the outer periphery of active patterns in N-well diffusion layer 10. Gate oxide film 83 is formed on N-well diffusion layer 10 and dummy pattern 126 is provided on a part of the surface of gate oxide film 83. Inter-layer insulation film 85 covering the side face and upper face of dummy pattern 126 is formed on gate oxide film 83, and wiring 55 is provided on inter-layer insulation film 85. Wiring 55 has its side face and upper face covered with insulation film 87.

Well-contact diffusion layer 91 is formed in N-well diffusion layer 10 under the site of gate oxide film 83 which is not covered with dummy pattern 126. Well-contact diffusion layer 91 has a higher concentration of N-type conductive impurities than that of N-well diffusion layer 10. Well-contact diffusion layer 91 is connected with wiring 55 via well contact 61 which is provided so as to pass through inter-layer insulation film 85 and gate oxide film 83.

As shown in FIG. 7, dummy pattern 126 and well contact 61 are alternately provided on the active pattern in the longitudinal direction of the standard cell. It is noted that well-contact diffusion layer 91 is concurrently formed in the source/drain electrode forming process of Nch-Tr elements 31 and 32.

As shown in FIG. 8, P-well diffusion layer 82 is provided from the surface of substrate 100 to a predetermined depth, and trench oxide film 81 is provided in the outer periphery of active patterns in P-well diffusion layer 82. Gate oxide film 83 is formed on P-well diffusion layer 82 and dummy pattern 128 is provided on a part of the surface of gate oxide film 83. Inter-layer insulation film 85 covering the side face and upper face of dummy pattern 128 is formed on gate oxide film 83, and wiring 57 is provided on inter-layer insulation film 85. Wiring 57 has its side face and upper face covered with insulation film 87.

Sub-contact diffusion layer 93 is formed in P-well diffusion layer 82 under the site of gate oxide film 83 which is not covered with dummy pattern 128. Sub-contact diffusion layer 93 has a higher concentration of P-type conductive impurities than that of P-well diffusion layer 82. Sub-contact diffusion layer 93 is connected with wiring 57 via sub-contact 63 which is provided so as to pass through inter-layer insulation film 85 and gate oxide film 83.

Making the impurity concentration in well-contact diffusion layer 91 and sub-contact diffusion layer 93 higher than that in the well-diffusion layer will reduce the contact resistance with the well diffusion layer thereby facilitating the supply of voltage from the wiring.

As shown in FIG. 8, dummy pattern 128 and sub-contact 63 are alternately provided on the active pattern in the longitudinal direction of the standard cell. It is noted that sub-contact diffusion layer 93 is concurrently formed in the source/drain electrode forming process of Pch-Tr elements 21 and 22.

Compensation capacity element 71 is configured to include dummy pattern 126, gate oxide film 83, and N-well diffusion layer 10. A capacity element made up of these three configurations is formed in the region of active pattern 42 shown in FIG. 2A. As so far described using FIG. 5, dummy pattern 126 is connected with wiring 57 via contact 66. Further, as described using FIG. 8, wiring 57 is connected with P-well diffusion layer 82 via sub-contact 63, as a result of which, dummy pattern 126 has the same electric potential as P-well diffusion layer 82.

Compensation capacity element 73 is configured to include dummy pattern 128, gate oxide film 83, and P-well diffusion layer 82. A capacity element made up of these three configurations is formed in the region of active pattern 44 shown in FIG. 2A. As so far described using FIG. 5, dummy pattern 128 is connected with wiring 55 via contact 68. Further, as described using FIG. 7, wiring 55 is connected with N-well diffusion layer 10 via well contact 61, as a result of which, dummy pattern 128 has the same electric potential as N-well diffusion layer 10.

It is noted that while the standard cell of the present embodiment has characteristic features in its pattern layout and in the structure formed associated therewith, it can be fabricated by using a usual manufacturing technology of semiconductor devices; therefore, detailed description on the manufacturing method of the standard cell of the present embodiment will be omitted.

Next, the actions by the standard cell having the above described configuration will be described.

A predetermined electric potential is applied to N-well diffusion layer 10 of the standard cell shown in FIG. 5 via wiring 55, and an electric potential lower than the foregoing electric potential is applied to P-well diffusion layer 82 via wiring 57. Hereafter, the higher one of the two types of electric potentials is referred to as a "high potential" and the lower one as a "low potential".

In compensation capacity element 71, dummy pattern 126 will be the electrode to which a low potential is applied; N-well diffusion layer 10 will be the electrode to which a high potential is applied; and gate oxide film 83 functions as a dielectric. This will result in a configuration in which a plurality of parallel plate capacity elements, each of which is made up of two electrodes interposing a dielectric, are connected in parallel. The capacity, owing to compensation capacity element 71, provides a compensation capacity between the high and low potential power supplies for suppressing fluctuation of the power supply voltage.

In compensation capacity element 73, dummy pattern 128 will be the electrode to which a high potential is applied; P-well diffusion layer 82 will be the electrode to which a low potential is applied; and gate oxide film 83 functions as a dielectric. This will result in a configuration in which a plurality of parallel plate capacity elements, each of which is made up of two electrodes interposing a dielectric, are connected in parallel. The capacity, owing to compensation capacity element 73, provides a compensation capacity between the high and low potential power supplies for suppressing fluctuation of the power supply voltage. Hereafter, a site where the parallel plate capacity element is formed is referred to as a capacity element forming site.

As so far described, in the present embodiment, by proving a capacity element in an active pattern utilizing a gate oxide film and a gate dummy pattern disposed in a standard cell, compensation capacity for controlling power supply noise is formed in the standard cell without an increase in the cell size. Providing a contact for supplying voltage to the well diffusion layer in an active pattern will enable disposing all those configurations within the standard cell and make them exhibit respective functions without sacrificing the contact and the gate dummy pattern.

Since it is possible to dispose all of contacts for supplying voltage to the well diffusion layer and to dispose gate dummy patterns to make up part of the configuration of the capacity element for controlling power supply noise, it is providing a compensation capacity for controlling noise in a quantity that is required for various power supplies without resulting in an increase in chip size is made possible.

Further, since the gate dummy pattern includes a dummy pattern for the purpose of reducing variation of the gate length when forming gate electrodes and for the purpose of planarization of inter-layer insulation films when applying CMP processing thereto, these objects can also be realized.

Example 1

Application examples of the standard cell of the present embodiment will be described. In this example, multiple kinds of standard cells including the standard cell of the present embodiment are disposed side by side along the X-direction and Y-direction.

Figure 9:
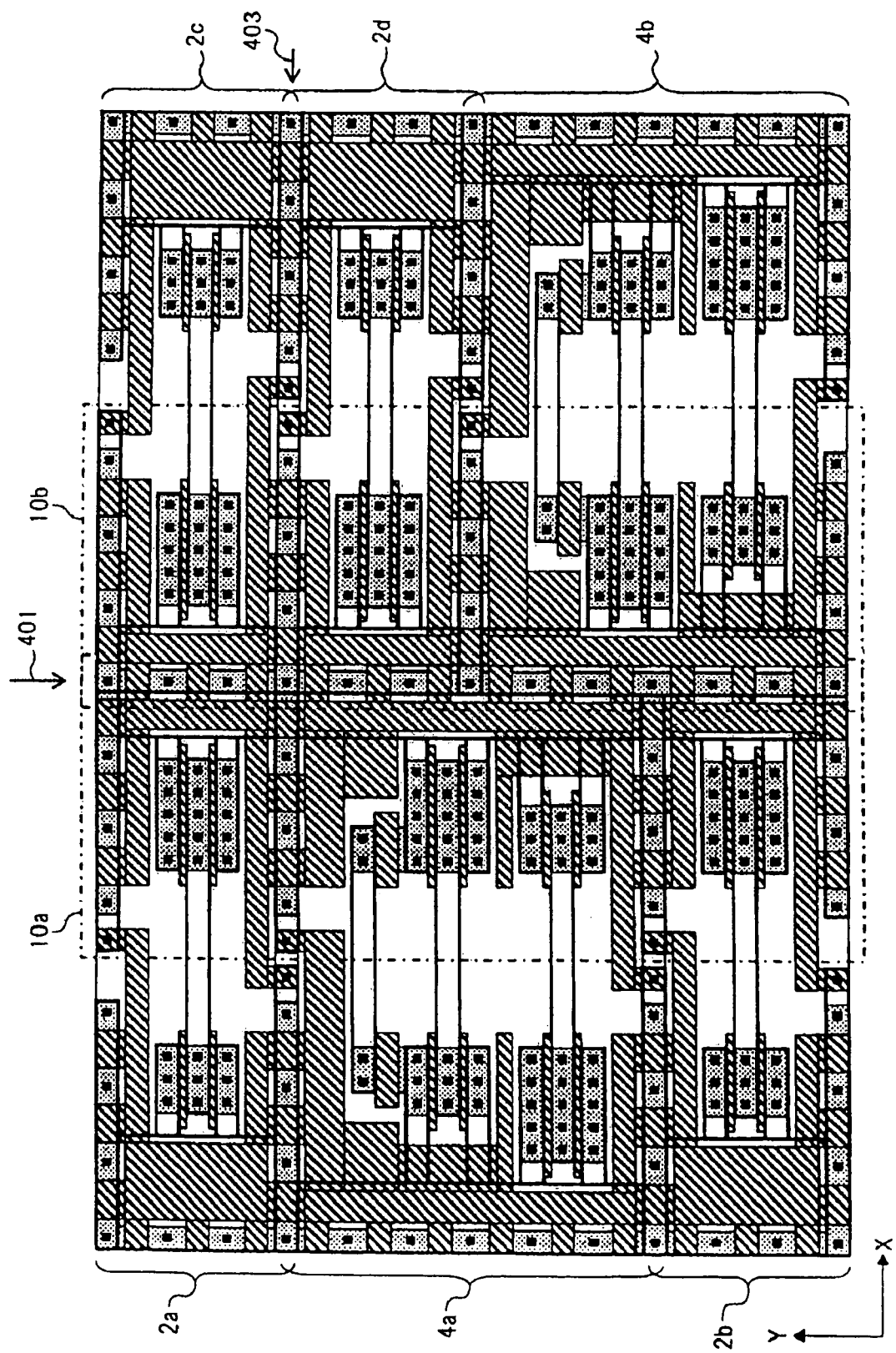
FIG. 9 is a plan perspective view to show a configuration example of a circuit in which multiple kinds of standard cells are placed side by side.

FIG. 9 is a plan perspective view to show a configuration example of a circuit in which multiple kinds of standard cells are placed side by side. The lateral direction of FIG. 9 is referred to as X-direction and the longitudinal direction as Y-direction. Two kinds of standard cells including the standard cell shown in FIG. 5 are utilized. The standard cell shown in FIG. 5 corresponds to standard cells 2a to 2d shown in FIG. 9, and the other kind of cell corresponds to standard cells 4a and 4b.

In the site indicated by arrow 401 of FIG. 9, adjacent portions between respective capacity element forming sites of standard cell 2a and standard cell 2c are overlapped. In a similar manner to this, the capacity element forming sites in the adjacent portions of standard cells 4a, 2b and standard cells 2d, 4b are overlapped. Accordingly, parts of N-well diffusion layer 10a and N-well diffusion layer 10b are overlapped as well. As a result of such disposition, the circuit area in the X-direction will be reduced by the amount of overlap indicated by arrow 401.

In the site indicated by arrow 403 of FIG. 9, capacity element forming sites in adjacent portions of standard cell 2c and standard cell 2d are overlapped. In a similar manner to this, the capacity element forming sites in respective adjacent portions of standard cell 2d and standard cell 4b, standard cell 2a and standard cell 4a, and standard cells 4a and standard cell 2b are overlapped. As a result of such disposition, the circuit area will be reduced in the Y-direction as well.

When disposing a plurality of standard cells side by side, by overlapping the capacity element forming sites of adjacent standard cells so as to allow the adjacent standard cells to share the use of the capacity element, reducing the area occupied by the circuit is made possible.

Figure 10:
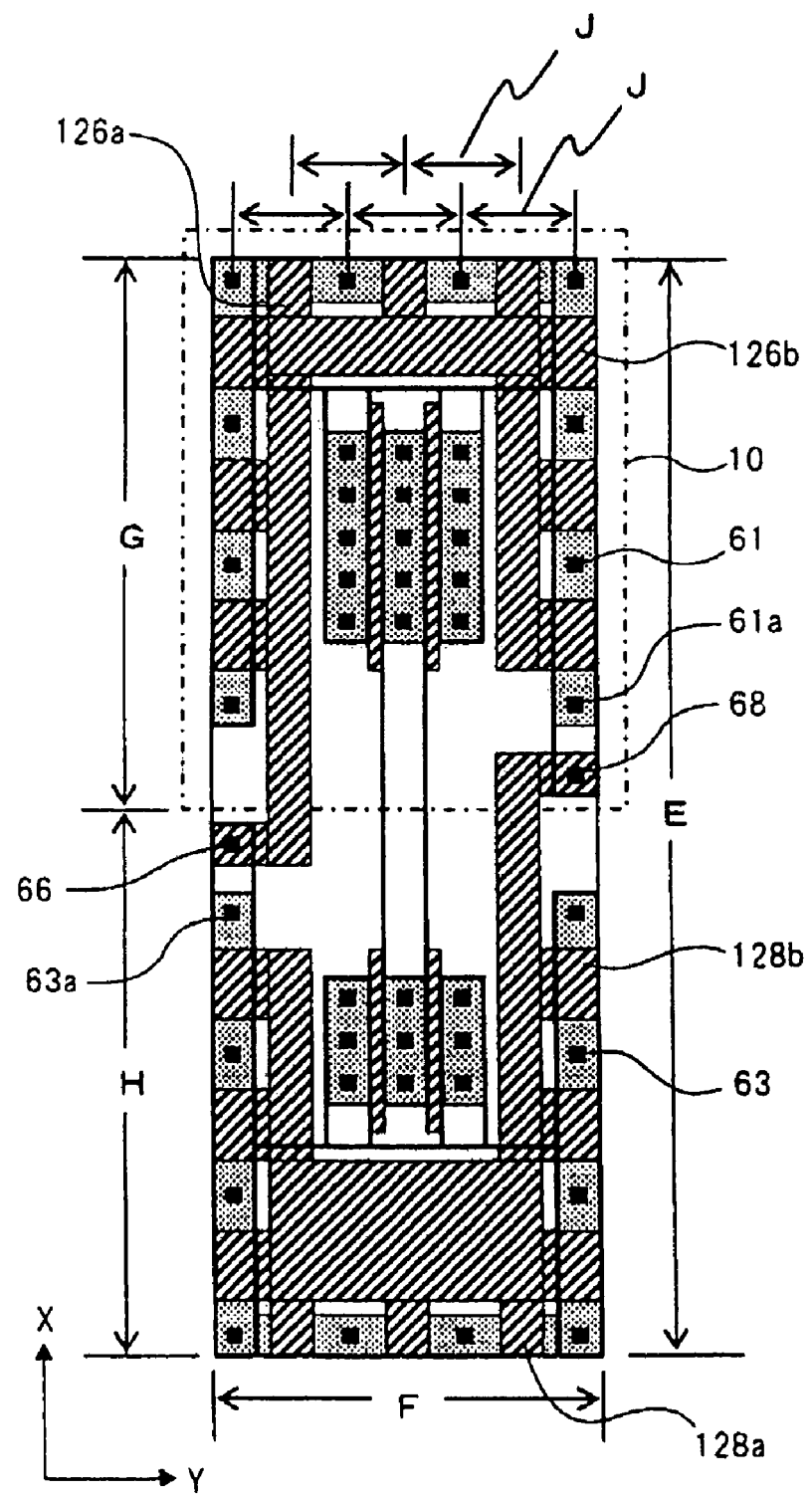
FIG. 10 is a plan perspective view to explain varicus dimensions in a standard cell.

Next, various dimensions in a standard cell will be described for the case in which standard cells are placed side by side along the X-direction and Y-direction as shown in FIG. 9. FIG. 10 is a plan perspective view to explain various dimensions in a standard cell where the standard cell shown in FIG. 5 is used. Moreover, the coordinate axes of FIG. 10 correspond to those of FIG. 9.

In FIG. 9, adjacent standard cells are disposed in such a way that the capacity element forming sites thereof are overlapped. In this case, it is desirable that length E of the standard cell in the longitudinal direction, length G of Pch-Tr element region in the longitudinal direction, and length H of Nch-Tr element region in the longitudinal direction are standardized for all kinds of standard cells that are to be disposed. Length F of the standard cell in Y-direction is adapted to be an integral multiple of a predetermined basic length. The basic length is, for example, 1.2 μm.

Further, in order to arrange that adjacent standard cells can share the use of a capacity element forming site, it is necessary make a configuration such that the well contacts or sub-contacts and the dummy patterns in the overlapping portions between adjacent standard cells correspond to one another adjacent standard cell. Describing this on the inner edge of the upper side of the cell in FIG. 10, the pitch of capacity electrode part 126a which is part of the capacity element of dummy pattern 126 is fixed, and the pitch of well contact 61 is fixed as well. Then, those pitches are set to have the same value J. This value of J corresponds to have above described predetermined basic length.

In this case, although description has been made of the inner edge of the cell on the side of Pch-Tr element region, the same is true with the respective pitches of capacity electrode part 128a and sub-contact 63 in the inner edge of the cell on the side of Nch-Tr element region.

The pitch of well contacts 61, which are disposed along the X-direction in respective left and right inner edges of the cell in FIG. 10, is fixed, and the pitch of sub-contact 63 is fixed as well. The pitches for capacity electrode parts 126b and 128b, which are disposed along the X-direction, are also fixed respectively. Further, the distance between well contact 61a and contact 68 is made equal to the distance between sub-contact 63a and contact 66.

In the present example, even when well contacts, sub-contacts, and gate dummy patterns are disposed in a standard cell, it is possible to form a capacity between power supplies having different voltages without increasing the size of the standard cell.

Though the number of standard cells mounted on a single chip varies depending on the scale of the chip and the design specifications of the mask layout, now, we consider cases of hundreds to thousands cells. Although the capacity which can be formed in a single chip is small, when hundreds to thousands of standard cells are mounted, the total capacity will become large making it possible to dispose a compensation capacity for controlling power supply noise within a chip in a sufficient quantity required for various power supplies without resulting in an increase in chip size.

In Patent Document 1, in view of the purpose of circuitry of the standard cell, it is considered to select the most important configuration from among a compensation capacity, a contact including a well contact and a sub-contact, and a gate dummy pattern, and the configuration selected is disposed in a circuit cell. In the present embodiment, it is possible to provide a compensation capacity, a well contact, a sub-contact, and a gate dummy pattern all within a standard cell. Therefore, it is possible to avoid such a case in which providing one of the patterns of those configurations prevents providing the other patterns, and thus to improve the reliability of products.

Second Embodiment

The present embodiment is another configuration example based on the standard cell which has been described in the first embodiment. It is noted that in this embodiment, description will be made concerning different points of the standard cell shown in FIG. 5, and description on similar configurations will be omitted. Further, configurations similar to those of the first embodiment are given the same.

The pattern of compensation capacity element will not be limited to the case of the standard cell shown in FIG. 5. The pattern of a compensation capacity element can have any geometry provided that a parallel plane capacity element having a gate oxide film as a dielectric can be configured by superposing an active pattern and a dummy pattern of gate electrode disposed in a standard cell, via a gate oxide film. Several examples will be described below.

Figure 11:
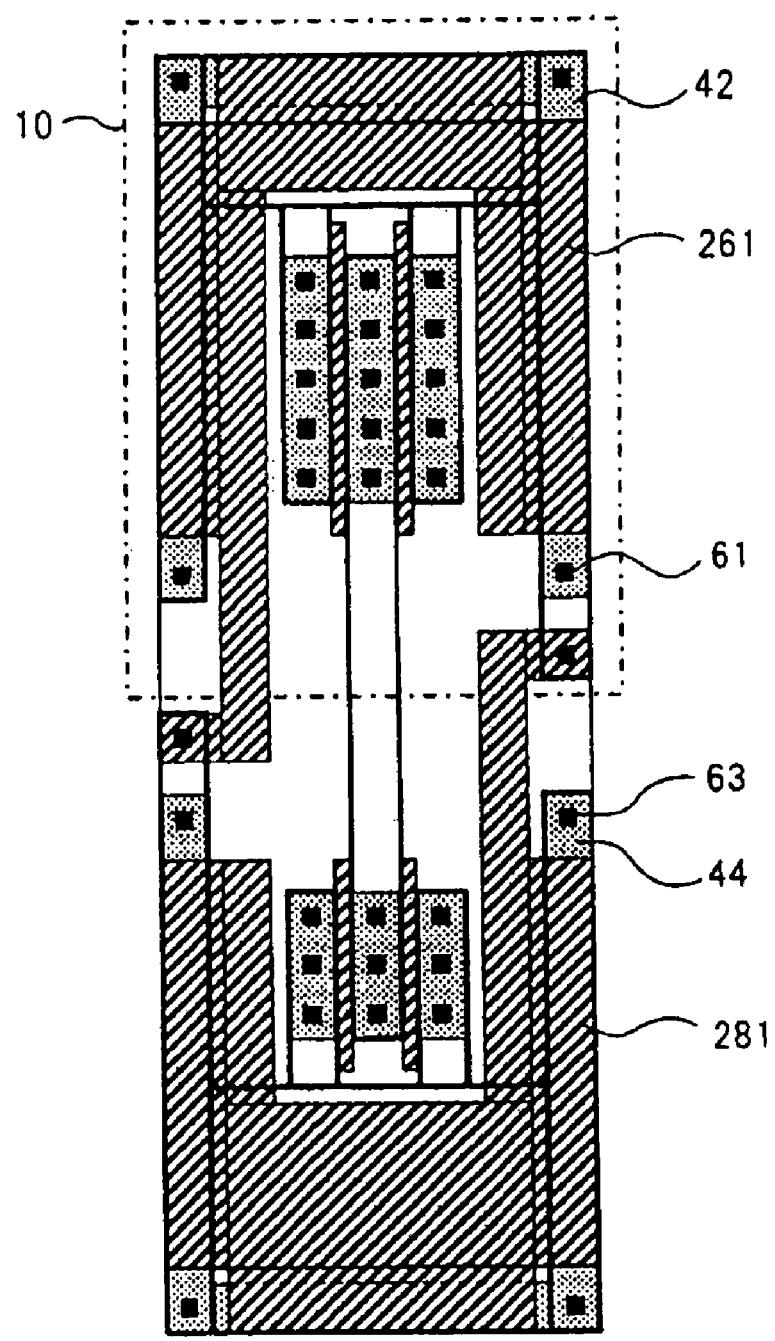
FIG. 11 is a plan perspective view to show a configuration example of the standard cell in a second embodiment.

FIG. 11 is a plan perspective view to show a configuration example of the standard cell in the present embodiment. The standard cell shown in FIG. 11 is configured such that the numbers of well contacts and sub-contacts connected to the active pattern in the inner edge of the cell are decreased compared with the standard cell shown in FIG. 5, thereby increasing the overlapping area between the dummy pattern and the well diffusion layer.

In the configuration example shown in FIG. 11, the number of well contacts 61 to be connected to active pattern 42 is decreased by 6 to 4 from 10 in the case shown in FIG. 5. Then dummy pattern 261 is enlarged over the free space where the contacts have been removed. Similarly to this, the number of sub-contacts 63 connected to active pattern 44 is decreased to 4 from 10 in the case of FIG. 5, and dummy pattern 281 is enlarged over the free space where the contacts have been removed. In this way, by enlarging the area of the opposing surface between the well diffusion layer and the dummy pattern in which a portion of surface area of the well diffusion layer corresponds to the corresponding surface area of the dummy pattern, the capacity value of the compensation capacity becomes larger than in the case shown in FIG. 5.

However, when the pattern as shown in FIG. 11 is used, the data rate of the gate pattern may become too large, and there is risk of degrading the planarization by CMP processing. In order to avoid this problem, the standard cell shown in FIG. 11 may be configured as follows.

Figure 12:
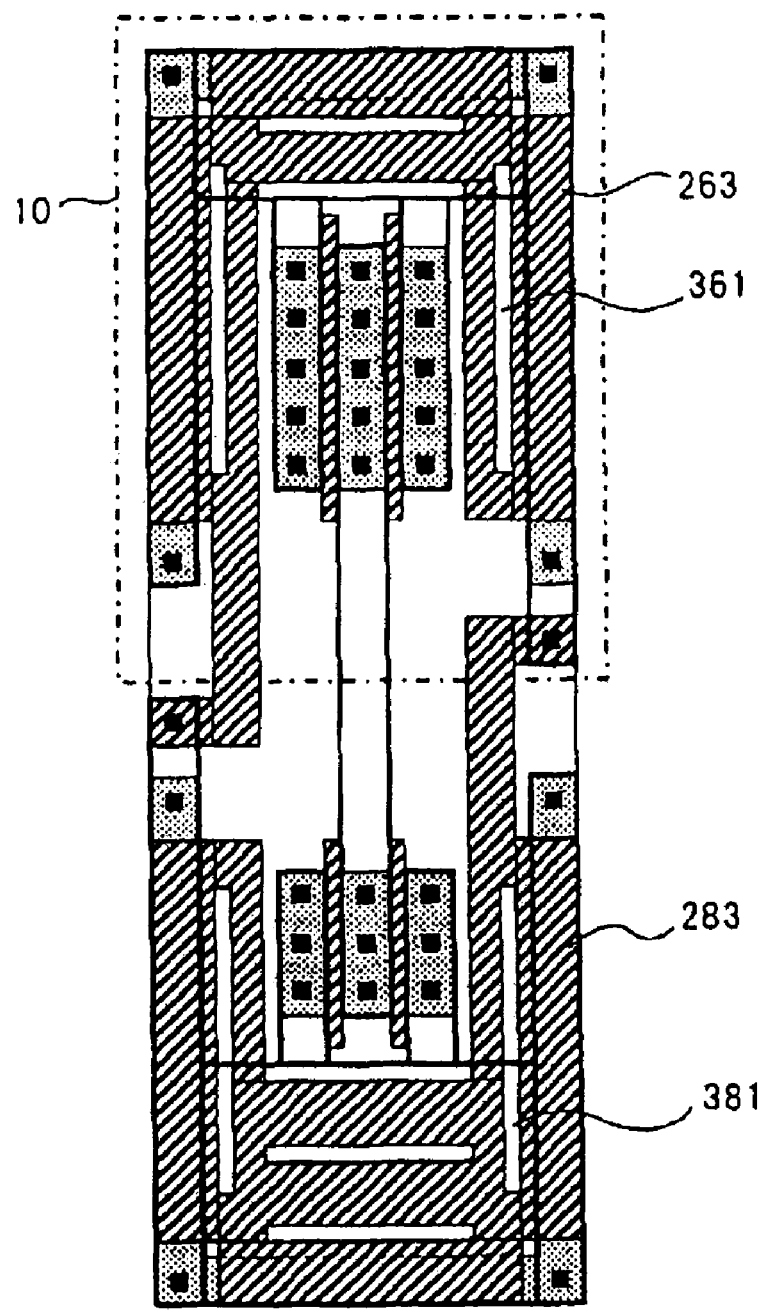
FIG. 12 is a plan perspective view to show another configuration example of the standard cell shown in FIG. 11.

FIG. 12 is a plan perspective view to show another configuration example of the standard cell shown in FIG. 11. By providing slit 361 in dummy pattern 261 shown in FIG. 11 to form dummy pattern 263 as shown in FIG. 12, the data rate of the gate pattern will be decreased. Similarly for the side of Nch-Tr element region, by providing dummy pattern 283 formed with slit 381, the data rate of the gate pattern will be decreased. Further, by adjusting the areas of slits 361 and 381, it is possible to adjust the data rate of the gate pattern.

Although the data rate of gate pattern suitable for CMP varies depending on the diffusion process, when the entire chip is divided into squares of about 20 μm, a range of 25% to 95% in each square is desirable.

Next, another standard cell which is configured to have a compensation capacity value larger than that of the standard cell shown in FIG. 5 will be described.

Figure 13:
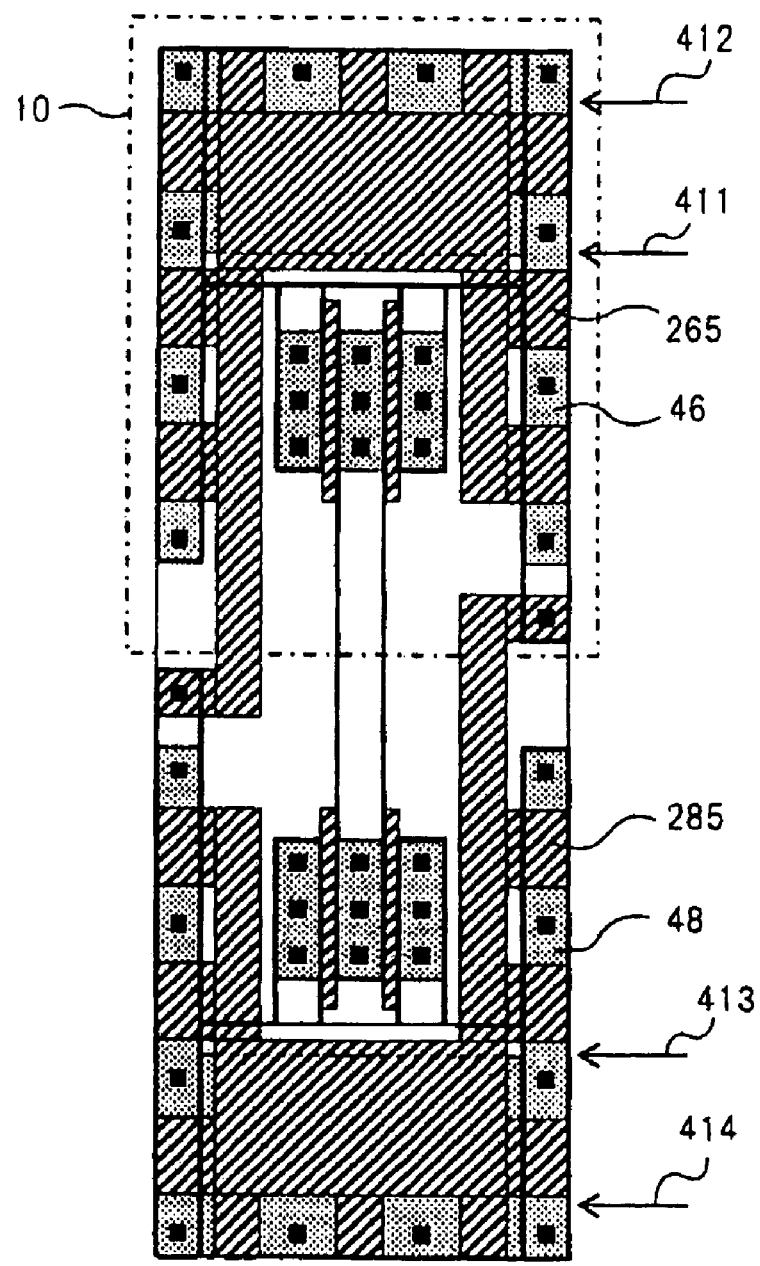
FIG. 13 is a plan perspective view to show another configuration example of the standard cell of the second embodiment.

FIG. 13 is a plan perspective view to show another configuration example of the standard cell of the present embodiment. The standard cell shown in FIG. 13 is configured such that the gate width of the Pch-Tr element is smaller than that of the standard cell shown in FIG. 5 and is equal to that of the Nch-Tr element. Decreasing the gate width will increase the area of dummy pattern 26 shown in FIG. 2B.

Further, the active pattern in the Pch-Tr element region is enlarged from arrow 412 to arrow 411 to be designated as active pattern 46. In FIG. 13, dummy pattern 26 shown in FIG. 2B is overlapped with active pattern 46 via gate oxide film 83 so that the area of the opposing surface between N-well diffusion layer 10 and dummy pattern 265 in which a portion of surface area of N-well diffusion layer 10 corresponds to the corresponding surface area of dummy pattern 265, is enlarged to be larger than in the standard cell shown in FIG. 5. Similarly, the active pattern in the Nch-Tr element region is expanded from arrow 414 to arrow 413 to be designated as active pattern 48. The area of the opposing surface between the P-well diffusion layer and dummy pattern 285 in which a portion of surface area of the P-well diffusion layer corresponds to the corresponding surface area of dummy pattern 285, is enlarged to be larger than in the standard cell shown in FIG. 5.

In this way, the compensation capacity of the standard cell becomes larger than in the case shown in FIG. 5. It is noted that although in FIG. 13, the gate width of the Pch-Tr element is made smaller than in the case shown in FIG. 5, the gate width may be the same as in the case shown in FIG. 5.

When expanding the area of active pattern as shown in FIG. 13, a contact may be provided in a part of the enlarged area rather than assigning all of the enlarged area to the compensation capacity element. Hereafter, examples of such a case will be described.

Figure 14:
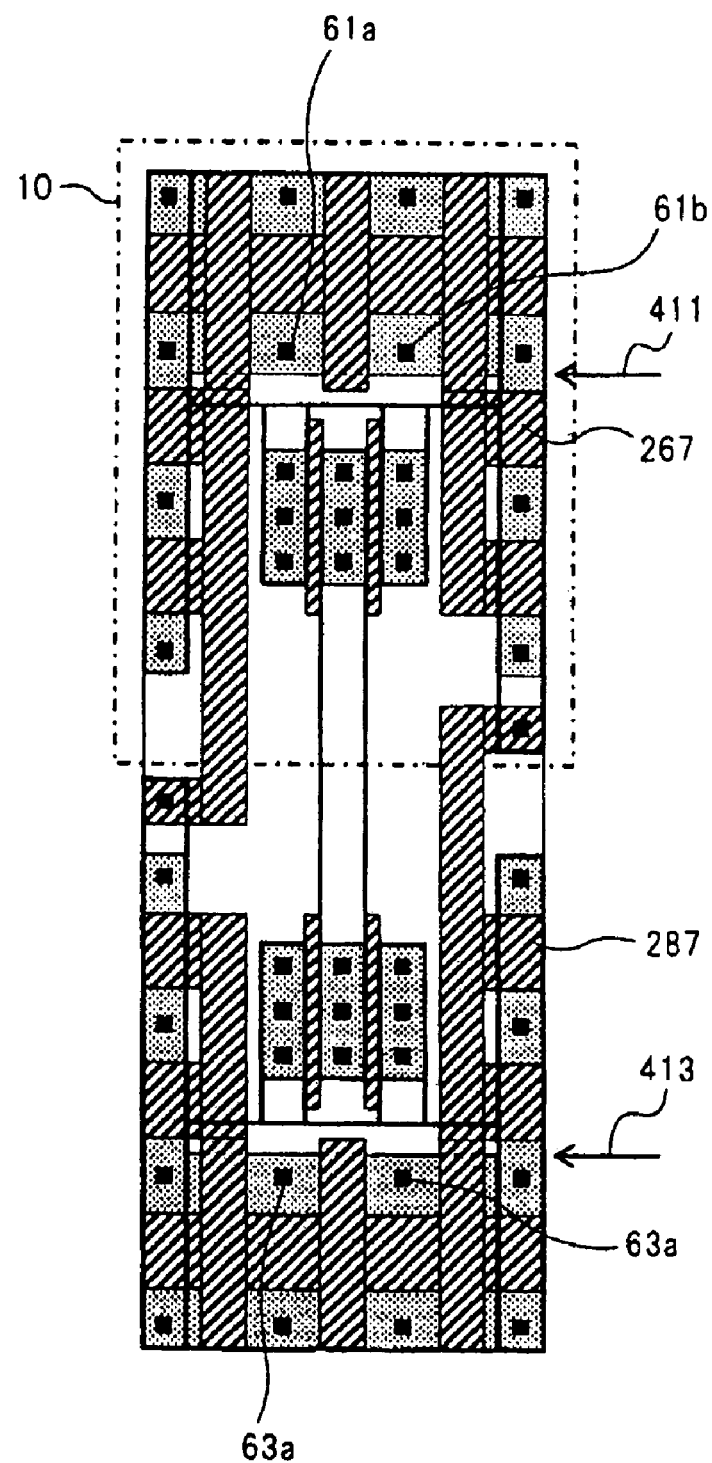
FIG. 14 is a plan perspective view to show another configuration example of the standard cell shown in FIG. 13.

FIG. 14 is a plan perspective view to show another configuration example of the standard cell shown in FIG. 13.

From dummy pattern 265 shown in FIG. 13, a part of the region near the Pch-Tr element is removed to form dummy pattern 267 as shown in FIG. 14. Then, well contacts 61a and 61b are provided in the site from where the part of dummy pattern has been removed. Similarly, from dummy pattern 285 shown in FIG. 13, a part of the region near the Nch-Tr element is removed to form dummy pattern 287 as shown in FIG. 14. Then, well contacts 63a and 63b are provided in the site from where the part of dummy pattern has been removed.

In this way, by increasing the number of contacts for supplying electric potential to N-well diffusion layer 10 and the P-well diffusion layer, the electric potential of N-well diffusion layer 10 and the P-well diffusion layer is more stabilized thereby improving anti-latchup characteristic.

It is noted that although, in the above described first and second embodiments, Nch-Tr elements and Pch-Tr elements are provided in each standard cell, one of them may be provided in each standard cell. Although description has been made that the standard cell is configured to include a Pch-Tr element region and an Nch-Tr element region, it may be a cell that includes at least either one of the element regions.

Further, although a gate oxide film is used for the dielectric of the compensation capacity element, other types of insulation films may be used. Moreover, description has been made of the case in which the standard cell is an inverter circuit (INV), the standard cell may be other logic circuits such as an NAND and NOR.

Third Embodiment

The configuration of a standard cell of the semiconductor device of the present embodiment will be described. The standard cell of the present embodiment is configured to include a resistance element. Configurations similar to those shown in FIGS. 3 and 4 are given like symbols, and detailed description thereof will be omitted. In the present embodiment, the case in which the resistance element is an N-type diffusion layer will be described.

Figure 15A:
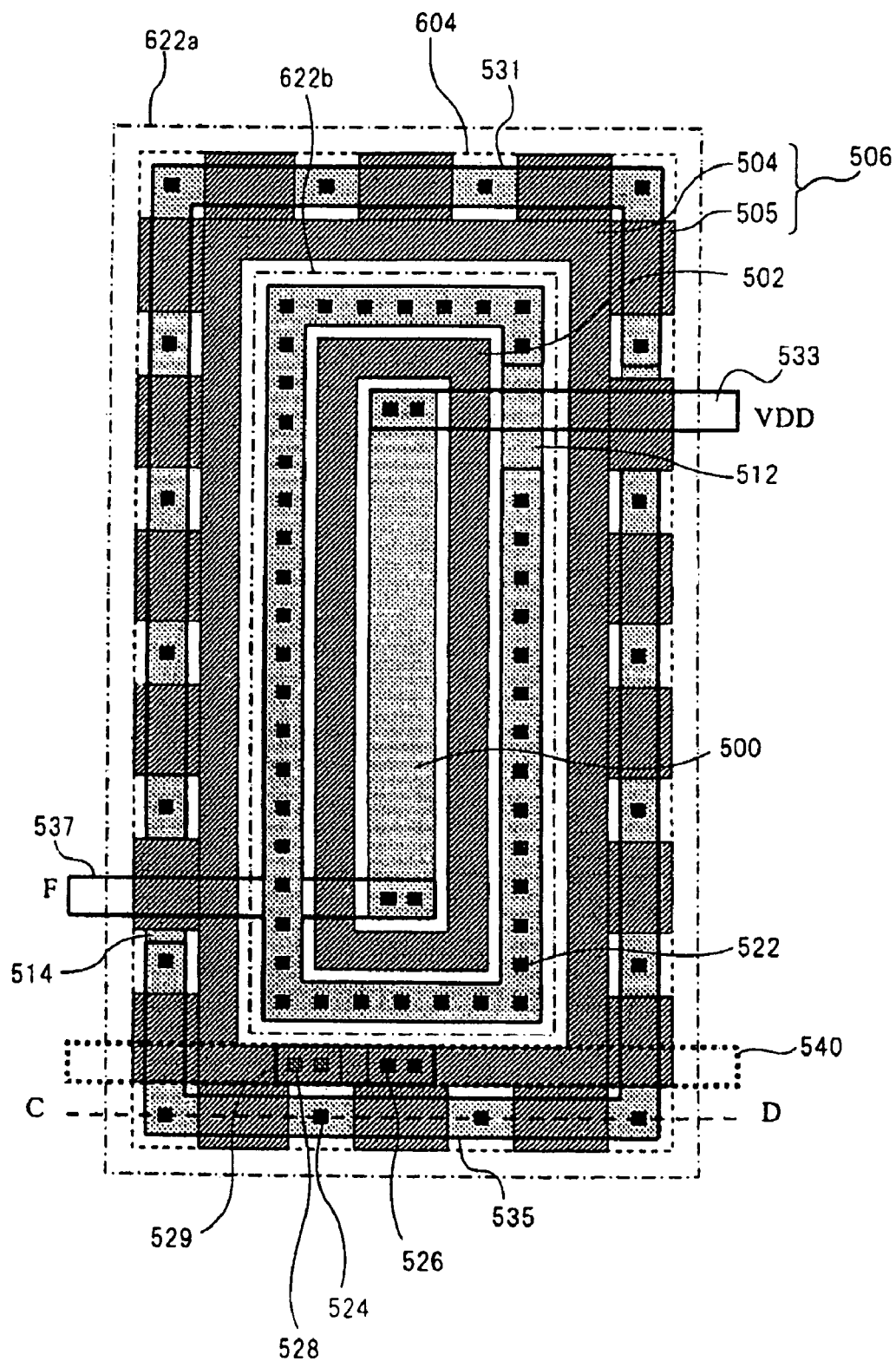
FIG. 15A is a plan perspective view to show a configuration example of the standard cell of a third embodiment.
Figure 15B:
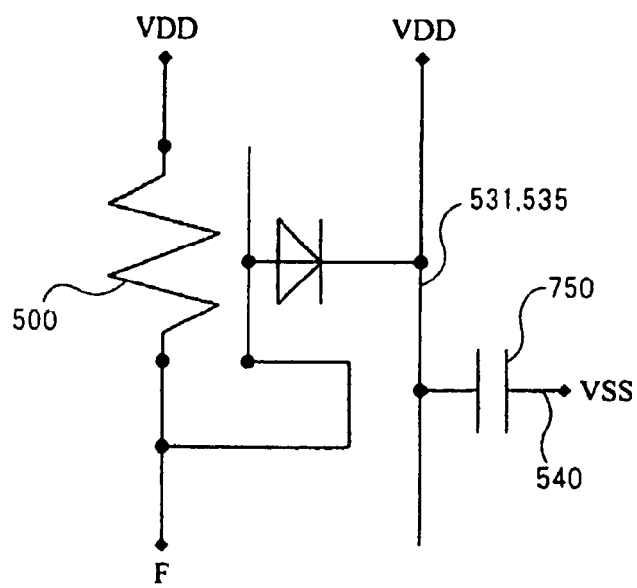
FIG. 15B shows an equivalent circuit of the standard cell shown in FIG. 15A.
Figure 16A:
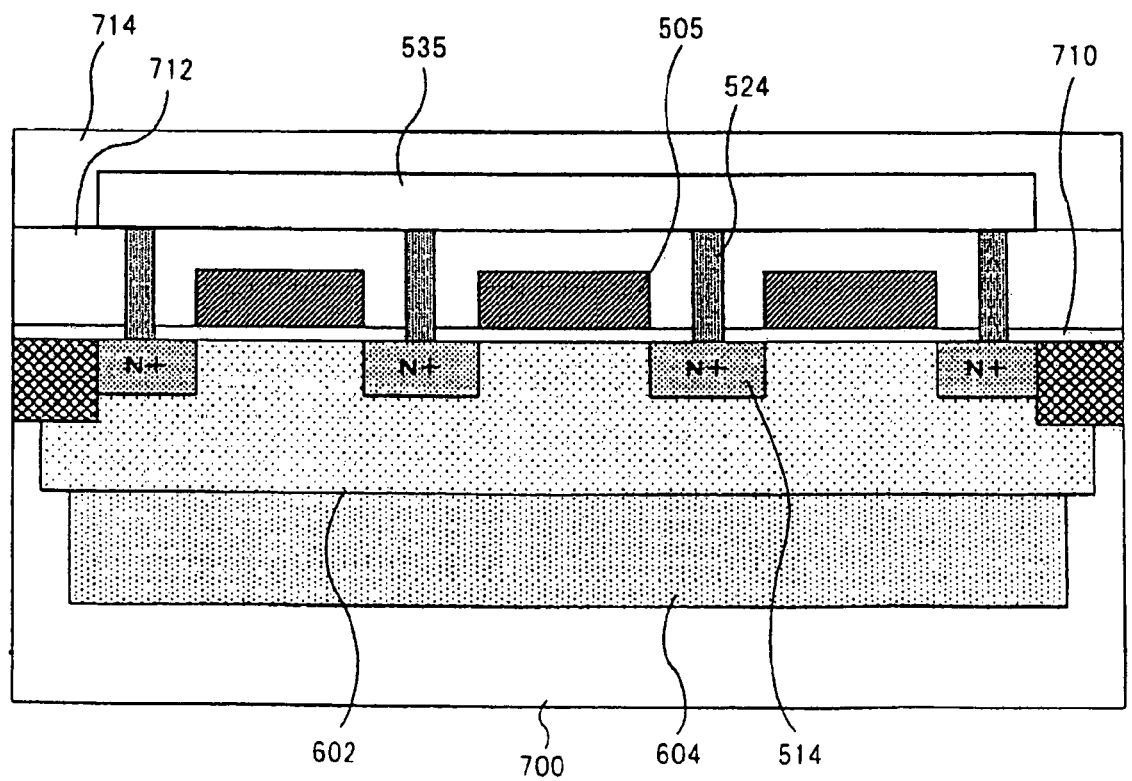
FIG. 16A is a sectional view taken along line C-D shown in FIG. 15A.

FIG. 15A is a plan perspective view to show a configuration example of the standard cell of the present embodiment; and FIG. 15B shows an equivalent circuit of the standard cell shown in FIG. 15A. FIG. 16A is a sectional view taken along line C-D shown in FIG. 15A.

Figure 3A:
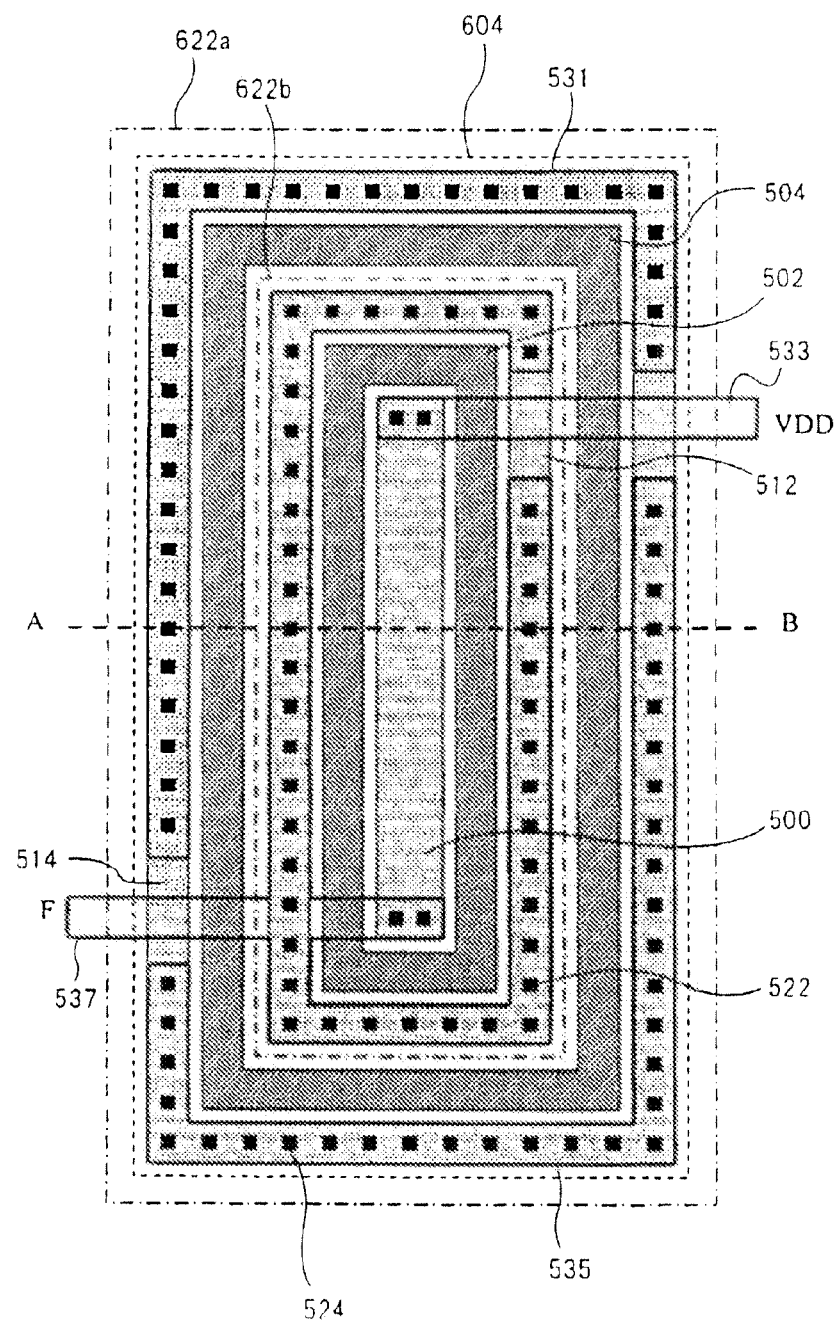
FIG. 3A is a plan perspective view to show a configuration example of a standard cell including a resistance element.
Figure 3B:
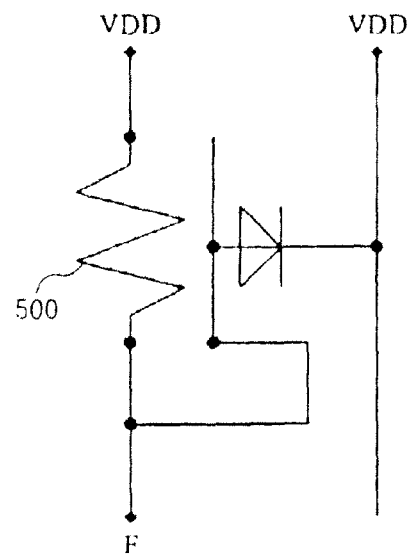
FIG. 3B shows an equivalent circuit of the standard cell shown in FIG. 3A.
Figure 4:
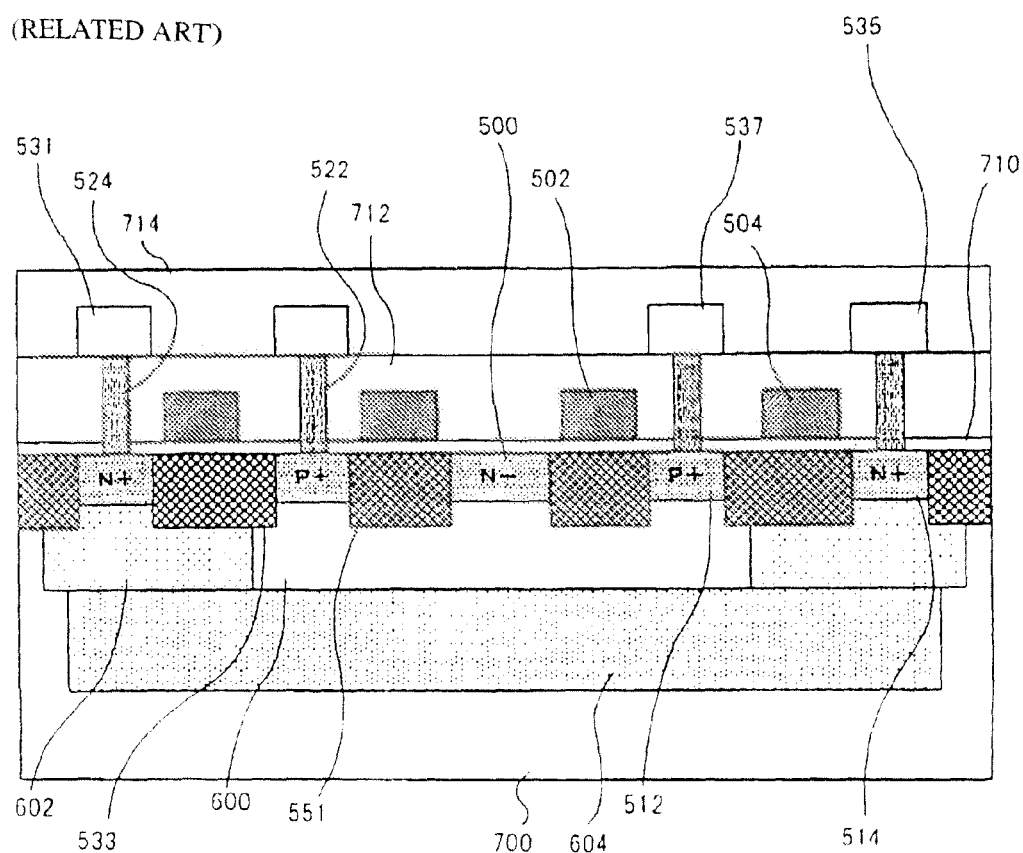
FIG. 4 is a sectional view taken along line A-B shown in FIG. 3A.

The standard cell of the present invention is provided with dummy pattern 506 which is formed by adding a plurality of enlarged parts 505 in the outer periphery of dummy pattern 504 shown in FIG. 3A. Dummy pattern 506 is formed for example in the same layer as the gate electrode of a transistor element not shown, and corresponds to a dummy pattern for planarization at the time of CMP processing. Enlarged part 505 of dummy pattern 506 is formed above N-well diffusion layer 602 via gate oxide film 710 as shown in FIG. 16A. With enlarged part 505 of dummy pattern 506 and N-well diffusion layer 602 being electrodes, and with gate oxide film 710 being an insulation film, it is realized that a configuration in which the insulation film is interposed by two electrodes is formed.

With a VDD potential applied to well-contact diffusion layer 514 and N-well diffusion layer 602 and with a low voltage potential which is lower than a VDD potential (hereafter, the low voltage potential is a ground potential VSS) applied to dummy pattern 506, a parallel plate capacitor having gate oxide film 710 as a dielectric is constituted of enlarged part 505 of dummy pattern 506, N-well diffusion layer 602, and gate oxide film 710. The capacity of the parallel plate capacitor provides a compensation capacity between VDD and VSS power supplies for the purpose of suppressing variation of power supply voltage. That is, the parallel plate capacitor provides a compensation capacity element for controlling power supply noise.

First aluminum wiring 540 is provided on insulation film 714 shown in FIG. 4. The reason why the wiring is referred to as first aluminum wiring 540 is that it has two characteristics: that the wiring is in the first layer of the wirings provided above insulation film 714, and that the conductive material thereof is aluminum. Although, the conductive material is aluminum in this case, other metals such as copper and tungsten may be used. The supply of a VSS potential to dummy pattern 506 is performed, as shown in FIG. 15A, via first aluminum wiring 540, contact 526, tungsten wiring 539, and contact 528. Hereafter, the connection relationship of these configurations will be described with reference to a sectional structure diagram.

Figure 16B:
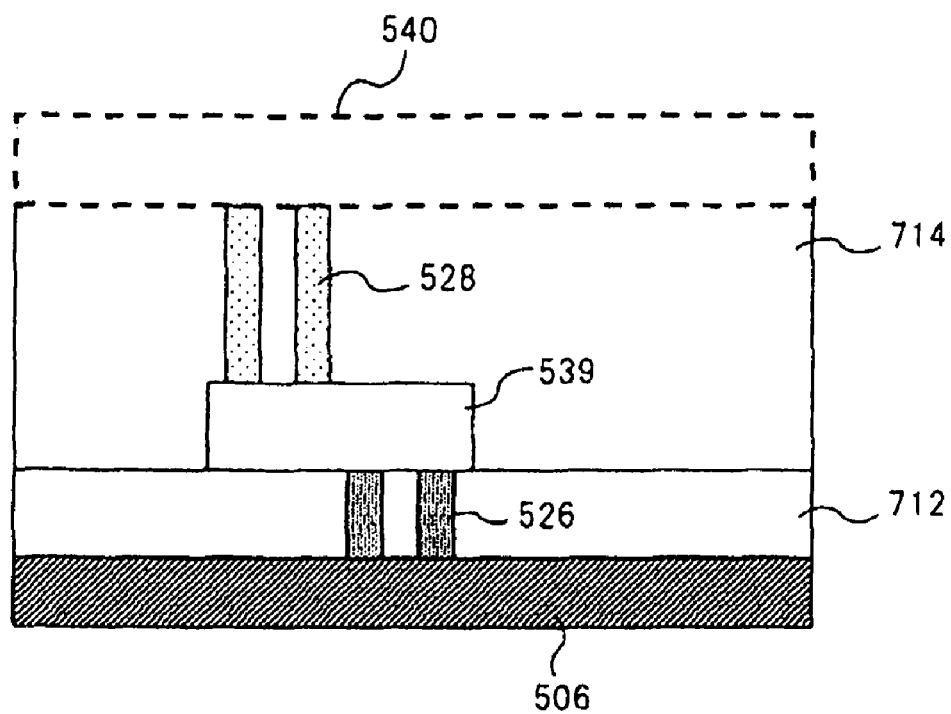
FIG. 16B shows a sectional structure at a site of a first aluminum wiring.

FIG. 16B shows a sectional structure at the site of first aluminum wiring 540. As shown in FIG. 16B, contact 526 made up of a conductive plug is provided in insulation film 712, and tungsten wiring 539 and contact 528 are provided in insulation film 714. Dummy pattern 506 is connected with tungsten wiring 539 via contact 526. First aluminum wiring 540 is connected with tungsten wiring 539 via contact 528. Tungsten wiring 539 serves as a pad for relaying the electrical connection between dummy pattern 506 and first aluminum wiring 540.

According to the configuration described above, compensation capacity element 750 is provided between tungsten wirings 531 and 535 to which a VDD potential is supplied, and to first aluminum wiring 540 to which a VSS potential is supplied, as shown in the equivalent circuit of FIG. 15B.

It is noted that in FIG. 15A, a boundary line for distinguishing dummy pattern 504 from enlarged part 505 is drawn on dummy pattern 506 in order to explain the enlarged pattern, but the boundary line is not provided on the pattern which is actually fabricated. Further, the outer edge of enlarged part 505 corresponds to deep N-well diffusion layer 604, but that is not necessarily so.

Further, the reason why the outer periphery of dummy pattern 504 is not uniformly enlarged, and instead a site where there is no dummy pattern above well-contact diffusion layer 514, is to provide well contact 524 for connecting tungsten wiring 535 with well-contact diffusion layer 514 as shown in FIG. 16A. This will cause well contact 524 and dummy pattern 506 to be electrically isolated so that the insulating property of the two electrodes of the compensation capacity is maintained.

In the standard cell of the present embodiment, a part of the dummy pattern, which is disposed between sub-contact diffusion layer 512 and well-contact diffusion layer 514, out of the dummy pattern disposed in the region of the cell including a resistance element, is enlarged toward the outside and is overlapped on well-contact diffusion layer 514 via gate oxide film 710. This configuration forms a parallel plate capacitor in which well-contact diffusion layer 514 to which a VDD potential is supplied and dummy pattern 506 to which a VSS potential is supplied serve as the electrode respectively, and gate oxide film 710 serves as a dielectric, and the capacity of this capacitor provides a compensation capacity between VDD-VSS power supplies for the purpose of suppressing the fluctuation of power supply voltage.

Further, to provide a VSS potential to dummy pattern 506, it is necessary to provide wiring for the VSS potential somewhere in the region of the standard cell, but generally a resistance element is susceptible to noise. Because of this, it is necessary to cut off noises to the resistance element from the signal wiring which is provided in an upper layer of the standard cell, such as a second aluminum wiring and a third aluminum wiring. To cut off the noise, the resistance element is covered with a shield by the first aluminum wiring fixed to a VSS potential, or the disposition of a signal line above the resistance element is avoided in many cases. Taking into consideration such a wiring layout, it is easy to provide a connection configuration for connecting the first aluminum wiring fixed to a VSS potential with dummy pattern 506, and the provision of such connection configuration will not be a demerit to the chip.

As described in the section of related art, in a DRAM, resistance elements are used in large numbers in a reference circuit for generating various reference voltages by resistive potential division. Since a reference circuit is made up of analog circuits, it is characteristically susceptible to noise and therefore it is especially important to dispose a compensation capacity for controlling power supply noise for a power supply used in a reference circuit. Further, concerning the location at which compensation capacity will be disposed, it is more effective in achieving noise reduction to dispose it in the vicinity of circuit elements rather than in free space that is distant from the circuit elements such as a resistance element.

The present embodiment makes it possible to utilize the well-contact diffusion layer disposed in the region of resistance element, and the dummy pattern for CMP processing to form compensation capacity for controlling power supply noise without resulting in an increase in the size of the standard cell including the resistance element.

Although there is a limit for the capacitive value of a capacity element which can be formed without changing the entire size of the standard cell, generally, in a DRAM, resistance elements based on a diffusion layer are disposed side by side in a certain number (equals about 50) and also configurations in which a certain number of them are disposed side by side are present in several locations within a chip. Therefore, the value that represents the total quantity of capacity throughout the chip becomes a large one thereby enabling the achievement of a satisfactory effect by way of the compensation capacity. Further, it is possible to dispose the compensation capacity element in the vicinity of the circuit element thereby demonstrating that a greater effect can be obtained in implementing counter measures against noise.

Example 2

The present example is configured such that a plurality of the standard cells shown in FIG. 15A are disposed side by side. Although it is possible to use the standard cell including a resistance element described in the third embodiment by singly disposing it as shown in FIG. 15A, it is often the case that a plurality of resistance elements are used by being placed side by side in a circuit of DRAM.

Figure 17A:
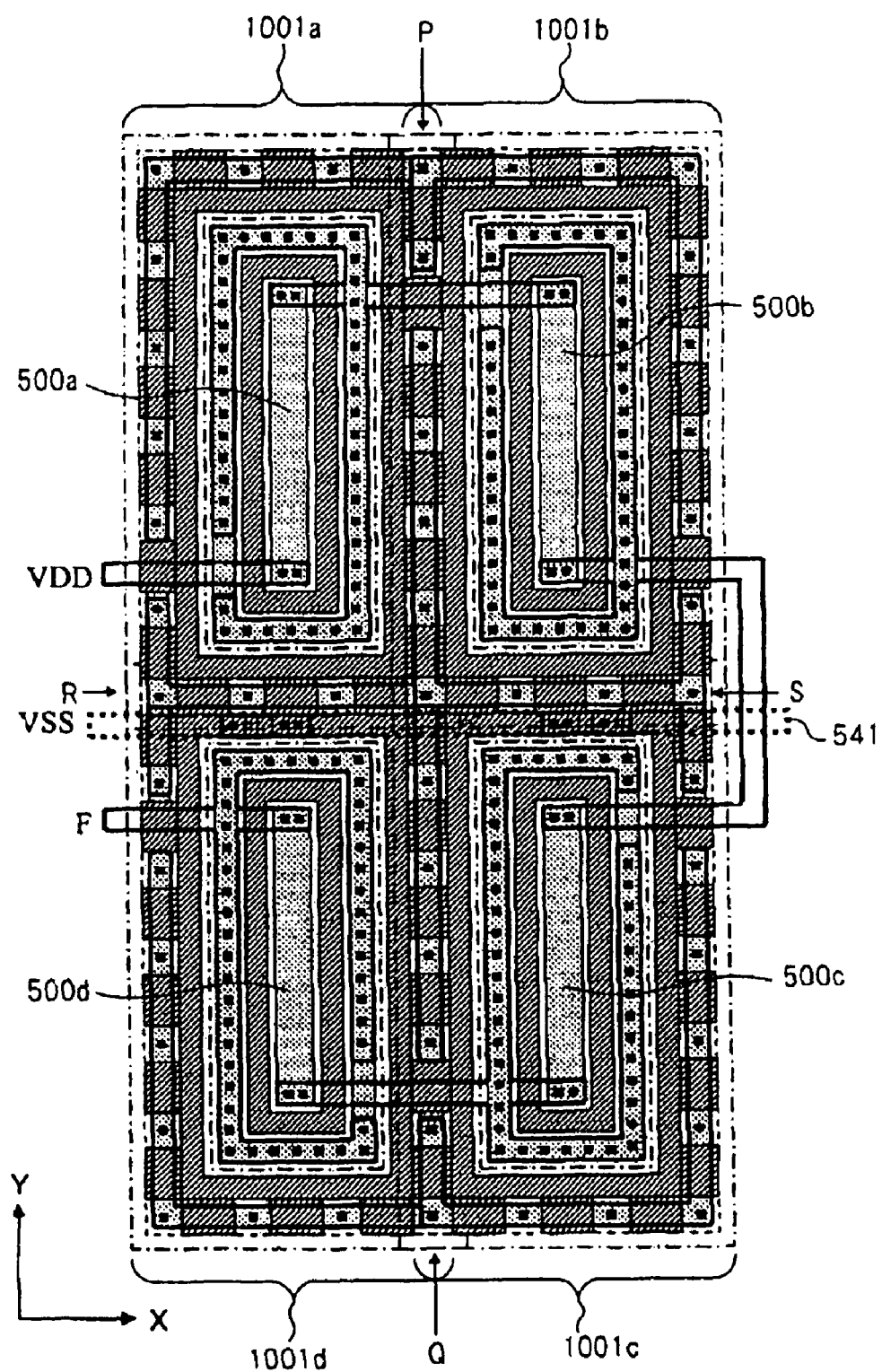
FIG. 17A is a plan perspective view to show a configuration example of a case in which a plurality of the standard cells shown in FIG. 15A are disposed side by side.

FIG. 17A is a plan perspective view to show a configuration example in a case in which a plurality of the standard cells shown in FIG. 15A are disposed side by side. With reference to two axes shown in FIG. 17A, four (2 rows×2 columns) standard cells 1001a to 1001d are disposed side by side. Resistance elements 500a, 500b, 500c, and 500d are series connected in order. When disposing standard cells 1001a to 1001d side by side, they are disposed such that sites of adjacent well-contact diffusion layers are overlapped. This will be described with reference to the drawings.

Standard cell 1001a and standard cell 1001b share the use of a compensation capacity element which is shown by arrow P of FIG. 17A and is made up of a well-contact diffusion layer, a gate oxide film, and a dummy pattern. Standard cell 1001c and standard cell 1001d share the use of a compensation capacity element which is shown by arrow Q of FIG. 17A and is made up of a well-contact diffusion layer, a gate oxide film, and a dummy pattern. Standard cell 1001a and standard cell 1001d share the use of a compensation capacity element which is shown by arrow R of FIG. 17A and is made up of a well-contact diffusion layer, a gate oxide film, and a dummy pattern. Standard cell 1001b and standard cell 1001c share the use of a compensation capacity element which is shown by arrow S of FIG. 17A and is made up of a well-contact diffusion layer, a gate oxide film, and a dummy pattern.

Figure 17B:
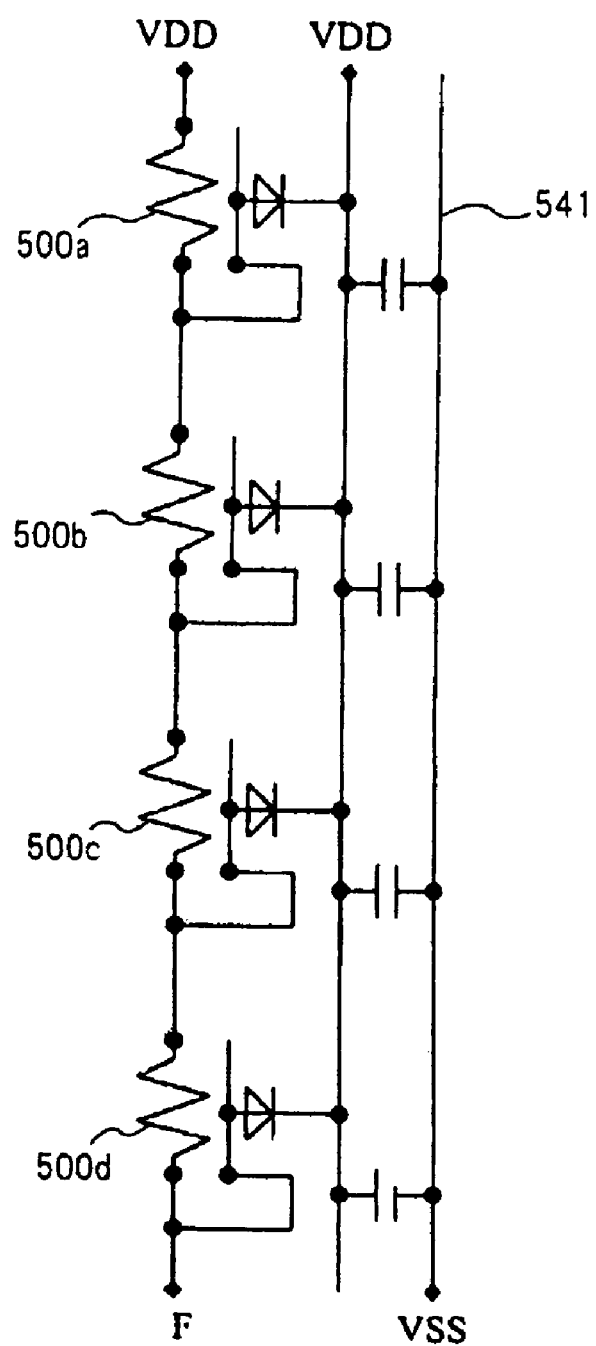
FIG. 17B shows an equivalent circuit of the configuration shown in FIG. 17A.

Respective dummy patterns 506 of standard cells 1001a to 1001d are electrically connected. A dummy pattern group, in which four dummy patterns 506 are connected into a unity, is connected with first aluminum wiring 541 via a contact, tungsten wiring, and a contact. In the example shown in FIG. 17A, the dummy pattern group is connected with first aluminum wiring 541 via contact 526, tungsten wiring 539, and contact 528 which are provided in each of standard cell 1001c and standard cell 1001d. As shown in FIG. 17B, the compensation capacity elements of respective standard cells are connected with first aluminum wiring 541.

As shown in FIG. 17A, in order to allow a plurality of standard cells 1001a to 1001d to be disposed, the overlapping portions between adjacent standard cells are configured to have the same geometry even when the standard cells are disposed in a mirrored manner with respect to each of the X-axis and Y-axis in the area that surrounds a standard cell.

Figure 18:
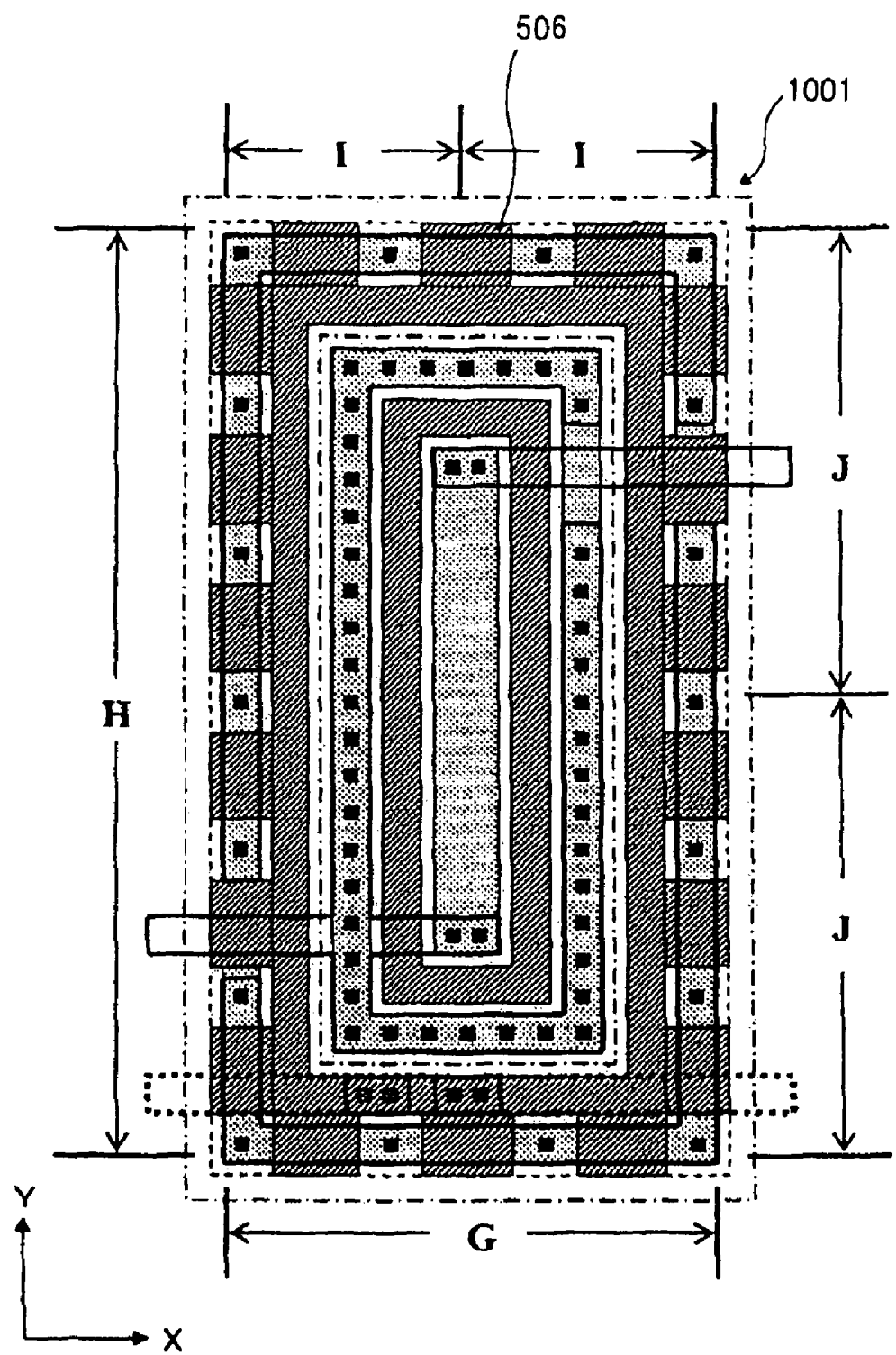
FIG. 18 is a plan view to show the layout of the standard cell of an example 2.

FIG. 18 is a plan view to show the layout of the standard cell of the present example. As shown in FIG. 18, the sizes of length G of standard cell 1001 in the X-axis direction (short-side length) and length H in the Y-axis direction (long-side length) are specified to be values divisible by two. The value of length G divided by 2 is indicated as "I", and the value of length H divided by 2 as "J".

Further, in order to enable the respective forming of a contact for supplying a predetermined electric potential to the well-contact diffusion layer and a compensation capacity element even when respective parts of adjacent standard cells are overlapped by being disposed in a mirrored manner, dummy pattern 506, which is superposed above a well-contact diffusion layer via a gate oxide film, is configured to have symmetric left and right geometries (two geometries of length I shown in FIG. 18) with the centerline halving length G in the X-axis direction as the axis of symmetry. For the same reason, dummy pattern 506 is configured to have symmetric upper and lower geometries (two geometries of length J shown in FIG. 18) with the centerline halving length H in Y-axis direction of the standard cell as the axis of symmetry.

In the present example, a plurality of the standard cells described in the third embodiment are provided in such a way that well-contact diffusion layers and dummy patterns disposed in the region of a standard cell are overlapped between adjacent standard cells. Thereafter, providing the dummy pattern with a low voltage potential (for example, VSS) opposite to the well-contact diffusion layer will result in the formation of a compensation capacity for controlling noise between VDD-VSS power supplies. Thus, without increasing the size of the standard cell shown in FIG. 3A and also without sacrificing respective functions of the well-contact diffusion layer and the dummy pattern provided in the standard cell, the well-contact diffusion layer and the dummy pattern can be utilized to form compensation capacity for controlling power supply noise.

Fourth Embodiment

The standard cell of the present embodiment is configured such that the capacity of the compensation capacity is increased compared with the standard cell described in the third embodiment. It is noted that in the drawing to explain the present embodiment, configurations similar to those of the standard cell described in the third embodiment are given the same symbols and detailed description thereof will be omitted.

In addition to the standard cell described in the third embodiment, the dummy pattern may be of any geometry provided that a parallel plate capacitor having a gate oxide film as a dielectric can be formed by superposing a well-contact diffusion layer and a dummy pattern via a gate oxide film.

Figure 19:
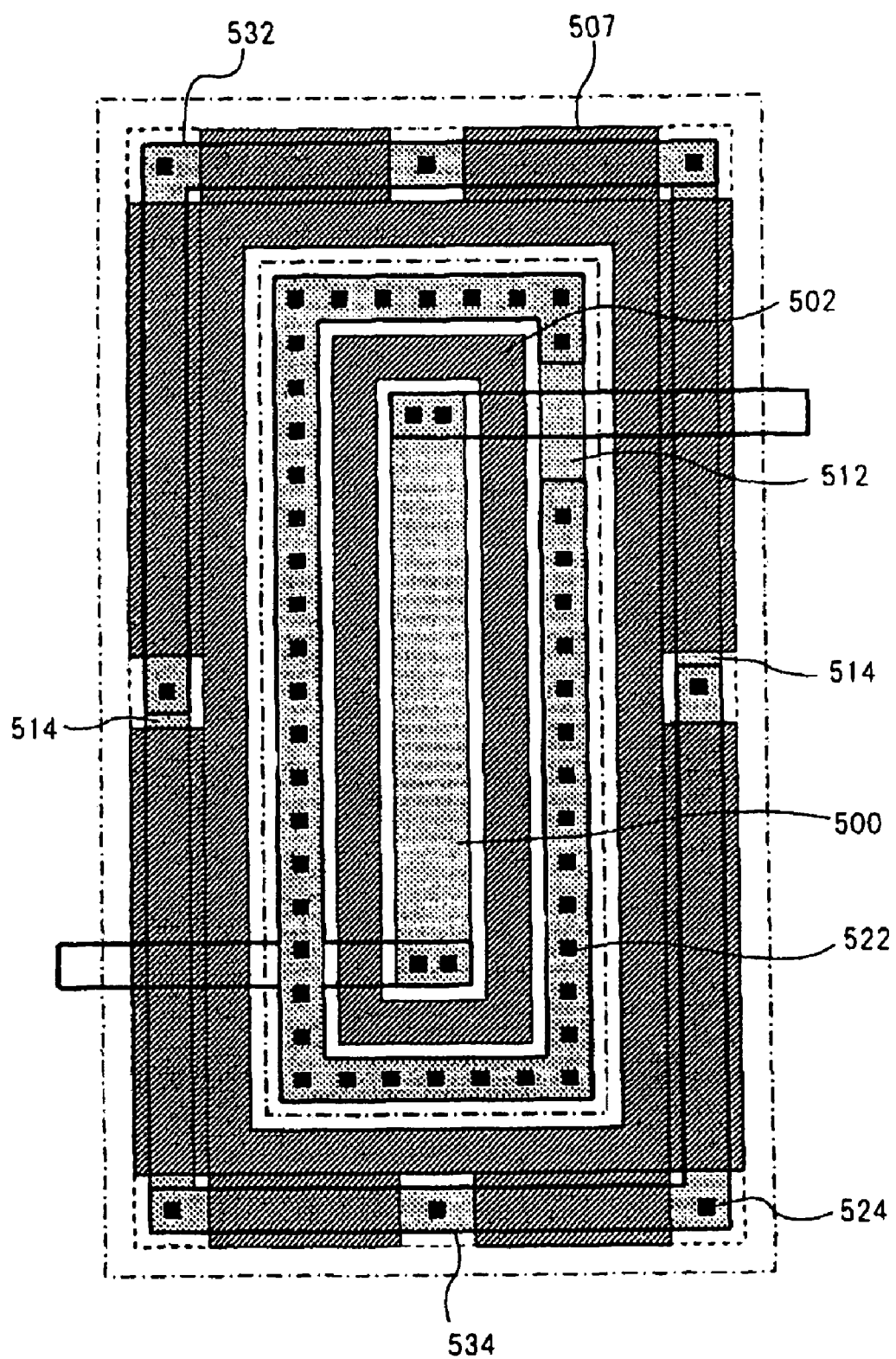
FIG. 19 is a plan perspective view to show a configuration example of a standard cell of a fourth embodiment.

FIG. 19 is a plan perspective view to show a configuration example of the standard cell of the present embodiment. As shown in FIG. 19, tungsten wiring 532 which is smaller in wiring length compared with tungsten wiring 531 shown in FIG. 15A is disposed in place of tungsten wiring 531. Further, the number of well contacts 524 for connecting tungsten wiring 532 with well-contact diffusion layer 514 is decreased from 9 to 4. By reducing the length of tungsten wiring and decreasing the number of well contacts, the overlapping area between well-contact diffusion layer 514 and dummy pattern 507 is increased accordingly.

Further, tungsten wiring 534 which is smaller in wiring length compared with tungsten wiring 535 shown in FIG. 15A is disposed in place of tungsten wiring 535. The number of well contacts 524 for connecting tungsten wiring 534 with well-contact diffusion layer 514 is decreased from 9 to 4. By reducing the length of tungsten wiring and decreasing the number of well contacts, the overlapping area between well-contact diffusion layer 514 and dummy pattern 507 is increased accordingly. In this way, the compensation capacity has been increased.

Figure 20:
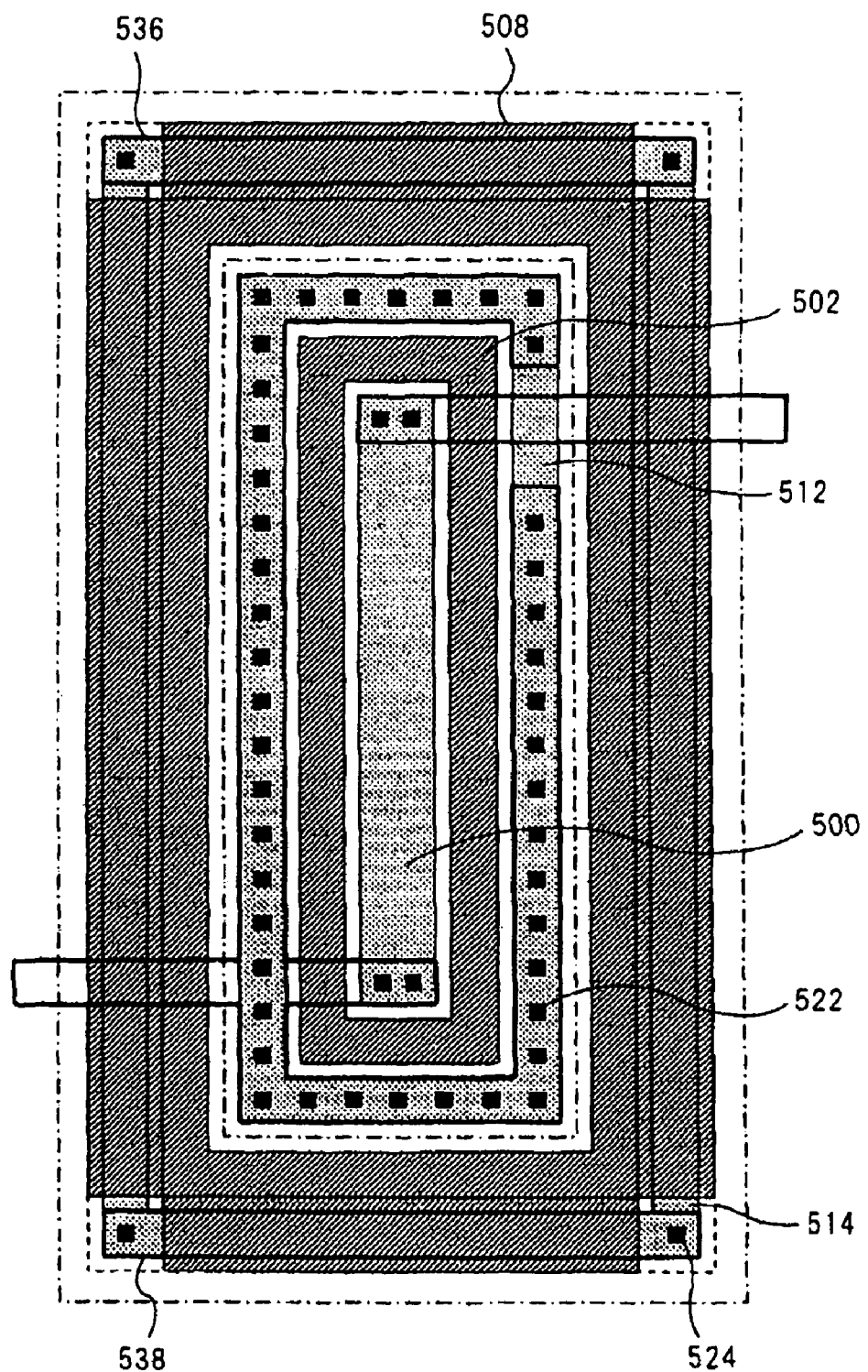
FIG. 20 is a plan perspective view to show another configuration example of a standard cell of the fourth embodiment.

FIG. 20 is a plan perspective view to show another configuration example of the standard cell of the present embodiment. In FIG. 20, the compensation capacity is further increased compared with the configuration shown in FIG. 19.

As shown in FIG. 20, tungsten wiring 536 corresponding to the short-side length of the standard cell is disposed in place of tungsten wiring 532 shown in FIG. 19. The number of well contacts 524 for connecting tungsten wiring 536 with well-contact diffusion layer 514 is decreased to 2 from 4 in the case of FIG. 19 so that well contacts 524 are only provided in two corners of the standard cell. By reducing the length of tungsten wiring and decreasing the number of well contacts, the overlapping area between well-contact diffusion layer 514 and dummy pattern 508 is further increased accordingly.

Further, as shown in FIG. 20, tungsten wiring 538 corresponding to the short-side length of the standard cell is disposed in place of tungsten wiring 534 shown in FIG. 19. The number of well contacts 524 for connecting tungsten wiring 538 with well-contact diffusion layer 514 is decreased from 4 to 2 in the case of FIG. 19 so that well contacts 524 are only provided in two corners of the standard cell. By reducing the length of tungsten wiring and decreasing the number of well contacts, the overlapping area between well-contact diffusion layer 514 and dummy pattern 508 is further increased accordingly.

According to the present embodiment, it is possible to increase the compensation capacity for controlling power supply noise, thereby improving immunity against noise.

Fifth Embodiment

Although, in the third and fourth embodiments, description has been made of the case in which the resistance element included in the standard cell is an N-type conductive diffusion layer, the present embodiment corresponds to the case in which the resistance element is a P-type conductive diffusion layer.

Figure 21A:
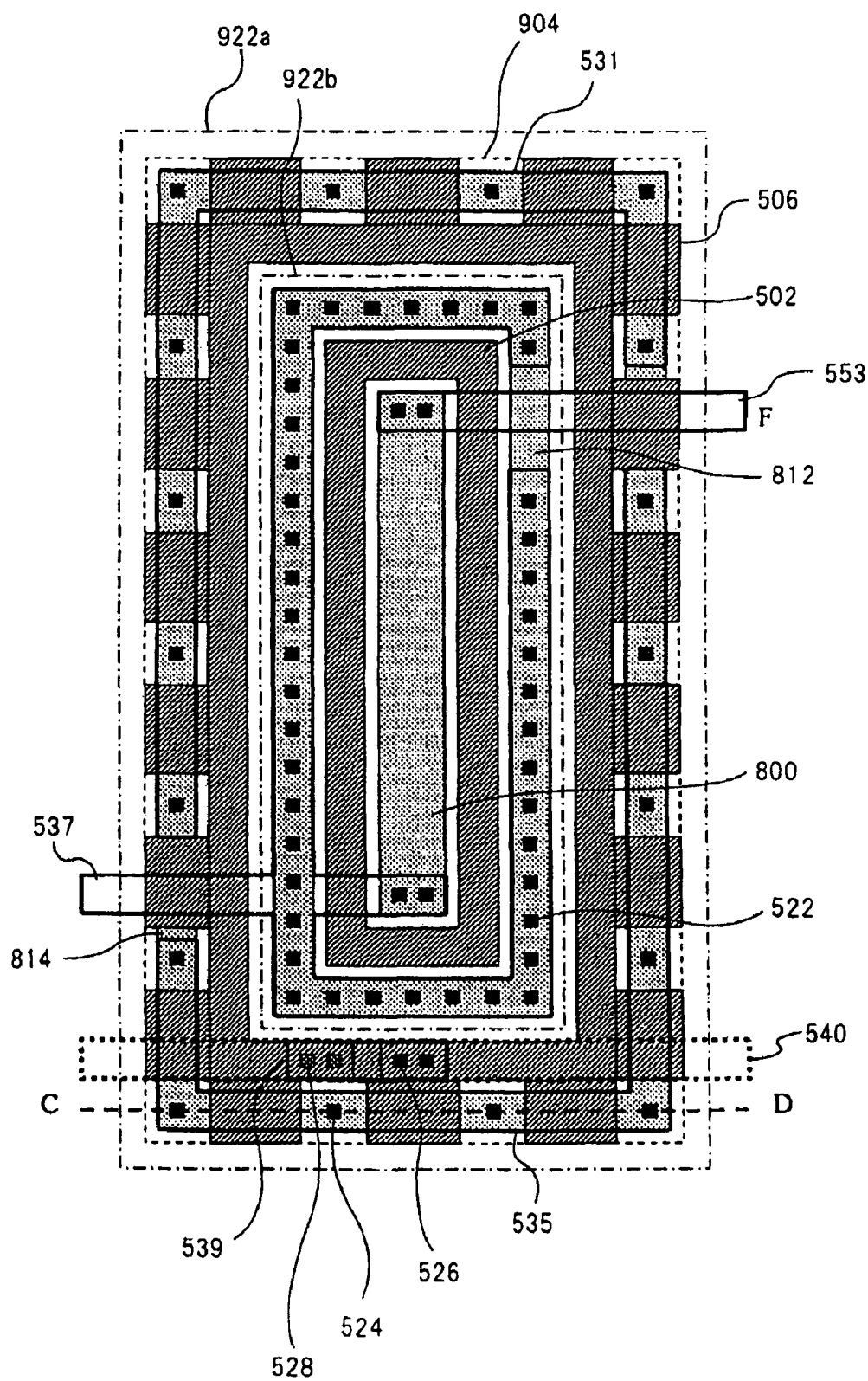
FIG. 21A is a plan perspective view to show a configuration example of a standard cell of a fifth embodiment.
Figure 21B:
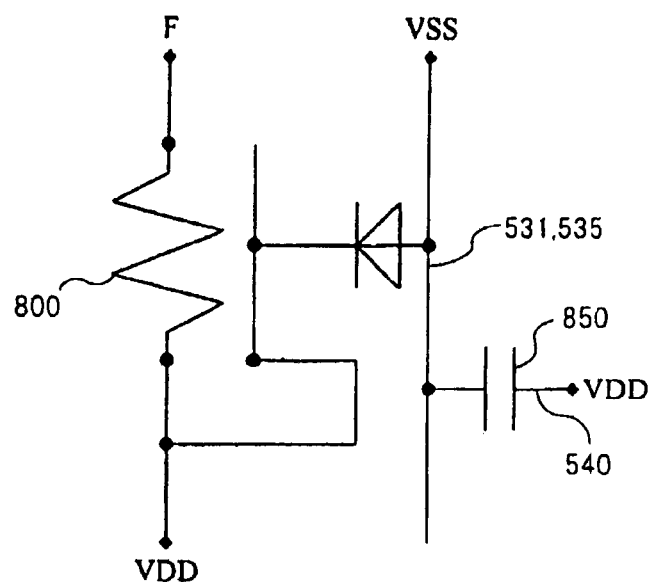
FIG. 21B shows an equivalent circuit of the standard cell shown in FIG. 21A.
Figure 22:
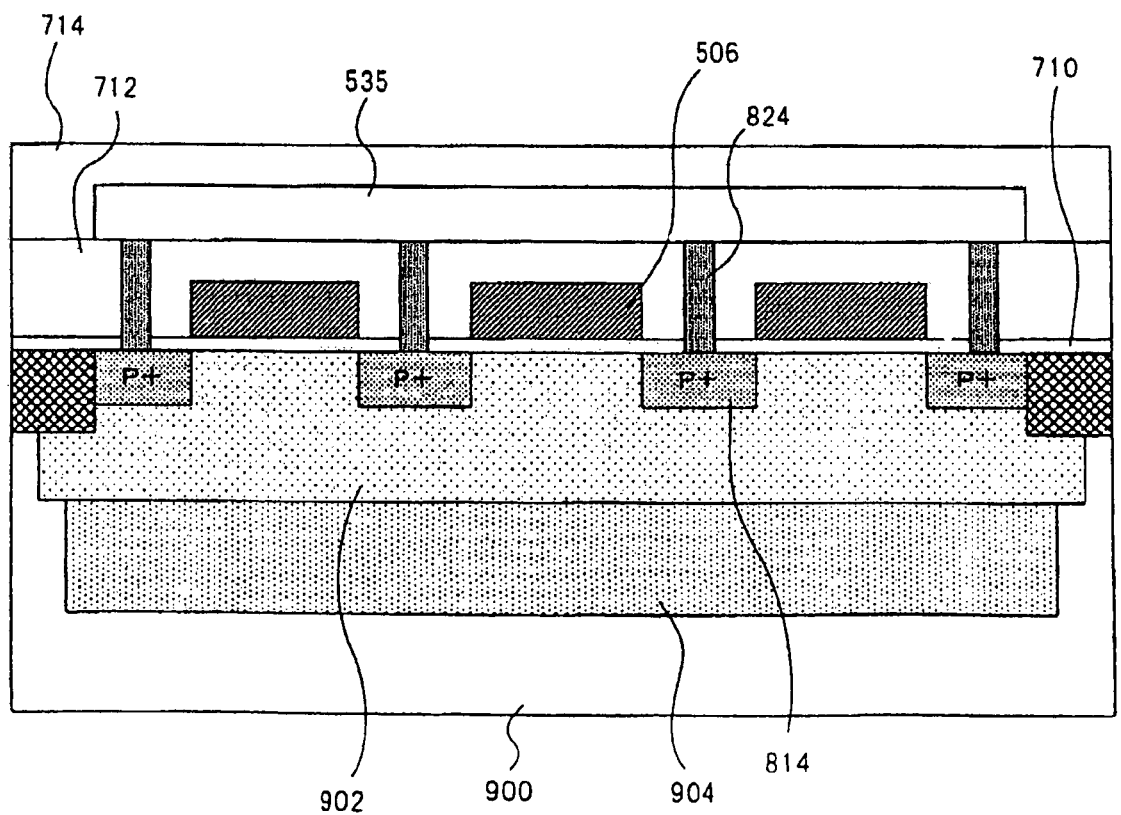
FIG. 22 is a sectional view taken along line C-D shown in FIG. 21A.

The configuration of the standard cell of the present embodiment will be described. FIG. 21A is a plan perspective view to show a configuration example of the standard cell of the present embodiment; FIG. 21B shows an equivalent circuit of the standard cell shown in FIG. 21A. FIG. 22 is a sectional view taken along a line C-D shown in FIG. 21A. It is noted that configurations similar to those shown in FIGS. 3A, 4, and 15A are given the same symbols and detailed description thereof will be omitted.

An N-well diffusion layer (not shown) is provided in each element-forming region of a resistance element and a MOS transistor, from the surface of N-type conductive substrate (hereafter simply referred to as an "N-substrate") 900 to a predetermined depth, and gate oxide film 710 is provided as an insulation film on the surface of N-substrate 900.

As shown in FIG. 21A, resistance element 800 is formed of a diffusion layer of a P-type conductive impurity and is formed in a region from the surface of an N-well diffusion layer (not shown) to a predetermined depth. P-well diffusion layer 902 is formed in the area that surrounds the N-well diffusion layer, and the side face of the N-well diffusion layer is covered with P-well diffusion layer 902. FIG. 21A shows outer edge 922a and inner edge 922b of the pattern of P-well diffusion layer 902. Further, deep P-well diffusion layer 904 is formed underneath the N-well diffusion layer, and the bottom face of the N-well diffusion layer is covered with deep P-well diffusion layer 904. Further, as shown in FIG. 22, deep P-well diffusion layer 904 is in contact with the bottom face of P-well diffusion layer 902.

Trench oxide film 551 shown in FIG. 4 is formed in the area that surrounds resistance element 800, and the side face of resistance element 800 is covered with trench oxide film 551. Dummy pattern 502 is provided on trench oxide film 551 in such a way to surround the forming region of resistance element 800 along the planer pattern of trench oxide film 551.

Sub-contact diffusion layer 812 into which an N-type conductive impurity is diffused is formed outside trench oxide film 551 shown in FIG. 4. Sub-contact diffusion layer 812 has a higher concentration of the conductive impurity than that of the N-well diffusion layer (not shown). The reason why sub-contact diffusion layer 812 has a higher concentration of the conductive impurity is to decrease the contact resistance between sub-contact 822 provided in the overlying layer and the N-well diffusion layer provided in the underlying layer. Trench oxide film 553 shown in FIG. 4 is formed in the area that surrounds sub-contact diffusion layer 812, and the side face of sub-contact diffusion layer 812 is covered with trench oxide film 553.

Well-contact diffusion layer 814 into which a P-type conductive impurity is diffused is formed in the area that surrounds trench oxide film 553. Since well-contact diffusion layer 814 has a higher concentration of the conductive impurity than that of P-well diffusion layer 902, it is designated as "P+" in FIG. 22. The reason why well-contact diffusion layer 814 has a higher concentration of the conductive impurity is to decrease the contact resistance between well contact 824 provided in the overlying layer and P-well diffusion layer 902 provided in the underlying layer.

The standard cell of the present embodiment is, as shown in FIG. 21A, provided with dummy pattern 506 which is formed by adding a plurality of enlarged parts in the outer periphery of dummy pattern 504 shown in FIG. 3A. The enlarged part of dummy pattern 506 is formed above P-well diffusion layer 902 via gate oxide film 710 as shown in FIG. 21A. It is assumed that the enlarged part of dummy pattern 506 and P-well diffusion layer 902 are the electrodes and gate oxide film 710 is the insulation film, a configuration in which an insulation film is interposed by two electrodes, is realized as shown in FIG. 22.

When a VSS potential is applied to well-contact diffusion layer 814 and P-well diffusion layer 902, and when a VDD potential is applied to dummy pattern 506, a parallel plate capacitor that as gate oxide film 710 as a dielectric will be made up of dummy pattern 506, P-well diffusion layer 902, and gate oxide film 710. The capacity of the parallel plate capacitor provides a compensation capacity between VDD and VSS power supplies for the purpose of suppressing the variation of power supply voltage. That is, the parallel plate capacitor provides a compensation capacity element for controlling power supply noise.

According to the above described configuration, compensation capacity element 850 is provided between tungsten wirings 531, 535 to which a VSS potential is supplied and first aluminum wiring 540 to which a VDD potential is supplied as shown in the equivalent circuit of FIG. 21B.

It is noted that although, in FIG. 21A, a boundary line is drawn on dummy pattern 506 to make the enlarged part more recognizable, the boundary line will not be provided on the pattern that is to be actually fabricated. Further, although the outer edge of the enlarged part corresponds to deep P-well diffusion layer 904, that is not necessarily so.

Further, the reason why the outer periphery of dummy pattern 504 shown in FIG. 15A is not uniformly enlarged, and instead a site free of dummy pattern is provided above well-contact diffusion layer 814, is to provide well contact 824 for connecting tungsten wiring 535 with well-contact diffusion layer 814 as shown in FIG. 22. This will cause well contact 824 and dummy pattern 506 to be electrically isolated so that the insulating performance between the two electrodes of the compensation capacity element is maintained.

The standard cell of the present embodiment will achieve a similar effect to that of the third embodiment even if the resistance element is a P-type conductive diffusion layer. It is noted that each of Example 2 and the fourth embodiment may be applied to the standard cell described in the present embodiment.

According to the present invention, preventing the increase of chip size and improving immunity against power supply noise are made possible.

It is apparent that the present invention is not limited to the above embodiments, but may be modified and changed without departing from the scope and spirit of the invention.

What is claimed is:

1. A standard cell, comprising:
    a first well diffusion layer into which a first conductive impurity is diffused;
    an insulation film provided on said first well diffusion layer;
    a first wiring for applying a predetermined electric potential to said first well diffusion layer, said first wiring being connected with said first well diffusion layer via a first contact passing through said insulation film;
    a first dummy pattern provided on said insulation film; and
    a second wiring for applying an electric potential different from said predetermined electric potential to said first dummy pattern, wherein
    said standard cell includes a first capacity element which is made up of said first dummy pattern, said insulation film and said first well diffusion layer.

2. The standard cell according to claim 1, comprising a first transistor element including a source electrode and a drain electrode, which are provided in said first well diffusion layer and which are made up of a diffusion layer that has a second conductive impurity whose conductivity is an opposite type to said first conductive impurity, and including a gate electrode provided in the same layer with said first dummy pattern.

3. The standard cell according to claim 2, further comprising:
    a second well diffusion layer into which said second conductive impurity is diffused;
    a third wiring for applying the same electric potential as said electric potential of said second wiring to said second well diffusion layer, said third wiring being connected with said second well diffusion layer via a second contact passing through said insulation film;
    a second transistor element including a source electrode and a drain electrode, which are provided in said second well diffusion layer and which are made up of a diffusion layer whose conductivity is the same type to said first conductive impurity and including a gate electrode provided in the same layer with said first dummy pattern; and
    a second dummy pattern provided on said insulation film, wherein
    said standard cell includes a second capacity element which is made up of said second dummy pattern, said insulation film and said second well diffusion layer.

4. The standard cell according to claim 3, wherein each of said first and second dummy patterns includes:
    a third dummy pattern provided in the same layer with said gate electrode and in parallel with said gate electrode of a corresponding transistor element; and
    a fourth dummy pattern for keeping a pattern density per unit area within a predetermined range, said fourth dummy pattern being provided in the same layer with said gate electrode.

5. The standard cell according to claim 4, wherein
    an outer shape of said standard cell is a rectangle;
    an active pattern, in which said insulation film is formed on a part of an upper face of said first well diffusion layer, is provided in an inner edge of each of two long-sides and one short-side of said rectangle along each side; and
    said third dummy pattern is provided between said first transistor element and said active pattern provided along said long-sides.

6. The standard cell according to claim 5, wherein
    said fourth dummy pattern is provided between said first transistor element and said active pattern provided along said short-side.

7. The standard cell according to claim 5, wherein
    said fourth dummy pattern is provided above said active pattern which is provided along said short-side, via said insulation film.

8. A semiconductor device, comprising a plurality of the standard cells according to claim 3, wherein
    a plurality of said standard cells are disposed such that said first or second capacity elements of adjacent standard cells are overlapped.

9. The standard cell according to claim 2, wherein
    an outer shape of said standard cell is a rectangle;
    an active pattern, in which said insulation film is formed on a part of an upper face of said first well diffusion layer, is provided in an inner edge of each of two long-sides and one short-side of said rectangle along each side; and
    a site of said active pattern, at which said first contact is connected to said first well diffusion layer, and said first dummy pattern are alternately provided along each side of said long-sides and said short-side.

10. A semiconductor device, comprising:
a first well diffusion layer made of a first conductive type;
first and second active patterns, which are made of said first conductive type, for respectively supplying a first electric potential to said first well diffusion layer, said first and second active patterns being provided in said first well diffusion layer; and
a first capacity provided in said first well diffusion layer, one terminal of said first capacity being supplied with said first electric potential, wherein
said first capacity is configured to be interposed between said first and second active patterns.

11. The semiconductor device according to claim 10, further comprising:
a second well diffusion layer, which is made of a second conductive type, provided adjacent to said first well diffusion layer; and
a third active pattern, which is made of said second conductive type, for supplying a second electric potential to said second well diffusion layer, said third active pattern being provided in said second well diffusion layer, wherein
the other terminal of said first capacity is electrically connected with said third active pattern.

12. The semiconductor device according to claim 11, further comprising:
a fourth active pattern, which is made of said second conductive type, for supplying said second electric potential to said second well diffusion layer, said fourth active pattern being provided in said second well diffusion layer; and
a second capacity provided in said second well diffusion layer, one terminal of said second capacity being electrically connected with either said first or said second active patterns or with both said first and said second active patterns, and the other terminal being supplied with said second electric potential, wherein
said second capacity is configured to be interposed between said third and fourth active patterns.

13. The semiconductor device according to claim 11, further comprising:
a first transistor including fifth and sixth active patterns provided in said first well diffusion layer, said fifth and sixth active patterns being made of said second conductive type; and
a second transistor including seventh and eighth active patterns provided in said second well diffusion layer, said seventh and eighth active patterns being made of said first conductive type.

14. The semiconductor device according to claim 10, further comprising:
a first transistor including fifth and sixth active patterns provided in said first well diffusion layer, said fifth and sixth active patterns being made of said second conductive type.

15. A semiconductor device comprising:
a first well region;
first and second active patterns formed in the first well region with sandwiching a part of the first well region therebetween, each of the first and second active patterns being equal in conductivity type to that of the first well region and supplied with a first potential to supply the first potential to the first well region; and
a wiring formed over the part of the first well region with an intervention of an insulating film therebetween, the wiring being supplied with a second potential different from the first potential,
the part of the first well, the wiring, and the insulating film constituting a capacitor.

16. The semiconductor device according to claim 15, further comprising a first transistor including third and fourth active patterns formed in the first well region, each of the third and fourth active patterns being different in conductivity type from the first well region.

17. The semiconductor device according to claim 16, wherein the third active pattern is supplied with the first potential and electrically independent of the fourth active pattern.

18. The semiconductor device according to claim 15, further comprising:
a second well region different in conductivity type from the first well region; and
a fifth active pattern formed in the second well region, the fifth active pattern being equal in conductivity type to that of the second well region and supplied with the second potential to supply the second potential to the second well region.

19. The semiconductor device according to claim 18, further comprising:
a sixth active pattern formed in the second well region apart from the fifth active pattern such that the fifth and sixth active pattern sandwich a part of the second well region therebetween; and
an additional wiring formed over the part of the second well region with an intervention of an additional insulating film therebetween, the wiring being supplied with the first potential,
the part of the second well, the additional wiring and the additional insulating film constituting an additional capacitor.

20. A semiconductor device comprising:
a first well region;
a plurality of active patterns formed in the first well region apart from each other to define at least one part of the first well region sandwiched by an adjacent two of the active patterns, each of the active patterns being equal in conductivity type to the first well region and supplied with a first potential; and
at least one wiring pattern formed over the at least one part of the first well region with an intervention of an insulating film, and the wiring pattern being supplied with a second potential different from the first potential.

21. The semiconductor device according to claim 20, wherein three or more active patterns are arranged in line to form two or more gaps between adjacent two of active patterns, and each of two or more wiring patterns being formed over the gap between associated adjacent two of the active patterns.

22. The semiconductor device according to claim 20, further comprising:
a second well region different in conductivity type from that of the first well region;
a plurality of additional active patterns formed in the first well region apart from each other to form at least one additional gap between adjacent two of the additional active patterns, each of the additional active patterns being equal in conductivity type to the second well region and supplied with the second potential; and
at least one additional wiring pattern formed over the additional gap with an intervention of an additional insulating film, and the additional wiring pattern being supplied with the first potential.

* * * * *